United States Patent
Nagai

(10) Patent No.: US 7,420,221 B2
(45) Date of Patent: Sep. 2, 2008

(54) SEMICONDUCTOR LIGHT-EMITTING DEVICE, LIGHTING MODULE, LIGHTING DEVICE AND METHOD FOR MANUFACTURING SEMICONDUCTOR LIGHT-EMITTING DEVICE

(75) Inventor: Hideo Nagai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/570,114

(22) PCT Filed: Sep. 1, 2005

(86) PCT No.: PCT/JP2005/016475

§ 371 (c)(1),
(2), (4) Date: Dec. 6, 2006

(87) PCT Pub. No.: WO2006/030678

PCT Pub. Date: Mar. 23, 2006

(65) Prior Publication Data

US 2007/0176193 A1    Aug. 2, 2007

(30) Foreign Application Priority Data

Sep. 17, 2004    (JP)    ............... 2004-272249

(51) Int. Cl.
*H01L 33/00* (2006.01)

(52) U.S. Cl. .................... 257/98; 257/95; 257/99; 257/100; 257/E33.061; 438/27

(58) Field of Classification Search .................. 257/95, 257/98, 99, 100, E33.061; 438/27
See application file for complete search history.

(56) References Cited

U.S. PATENT DOCUMENTS

| | | | |
|---|---|---|---|
| 6,332,701 B1 * | 12/2001 | Yamada et al. | 362/517 |
| 6,642,652 B2 * | 11/2003 | Collins et al. | 313/512 |
| 7,087,936 B2 * | 8/2006 | Negley | 257/98 |
| 7,279,724 B2 * | 10/2007 | Collins et al. | 257/103 |
| 2002/0070449 A1 * | 6/2002 | Yagi et al. | 257/734 |
| 2002/0190260 A1 | 12/2002 | Shen et al. | |
| 2004/0095063 A1 | 5/2004 | Murazaki et al. | |
| 2004/0178417 A1 | 9/2004 | Andrews | |
| 2004/0188696 A1 * | 9/2004 | Chen et al. | 257/99 |

(Continued)

FOREIGN PATENT DOCUMENTS

EP    0 854 523    7/1998

(Continued)

*Primary Examiner*—Evan Pert
*Assistant Examiner*—Victor A Mandala, Jr.
(74) *Attorney, Agent, or Firm*—Hamre, Schumann, Mueller & Larson, P.C.

(57) ABSTRACT

A semiconductor light-emitting device includes: a semiconductor multilayer film, a substrate supporting the semiconductor multilayer film; and a phosphor layer formed on the substrate so as to cover the semiconductor multilayer film. The phosphor layer has an outer edge of a cross section taken in a direction parallel to the principal surface of the substrate having a substantially circular shape or a substantially regular polygonal shape having five or more sides. An outer edge of the principal surface of the substrate is formed in a substantially circular shape or a substantially regular polygonal shape having five or more sides. With this configuration, light obtained therefrom has less non-uniformity in color and a high luminous flux can be realized.

12 Claims, 23 Drawing Sheets

U.S. PATENT DOCUMENTS

| | | | |
|---|---|---|---|
| 2005/0127833 A1* | 6/2005 | Tieszen | 313/512 |
| 2006/0076883 A1* | 4/2006 | Himaki et al. | 313/503 |
| 2006/0102915 A1* | 5/2006 | Kim | 257/98 |
| 2006/0261364 A1* | 11/2006 | Suehiro et al. | 257/100 |

FOREIGN PATENT DOCUMENTS

| | | |
|---|---|---|
| EP | 1 020 935 | 7/2000 |
| EP | 1 385 216 | 1/2004 |
| EP | 1 416 219 | 5/2004 |
| EP | 1 418 630 | 5/2004 |
| JP | 2001-015817 | 1/2001 |
| JP | 3399440 | 2/2003 |
| JP | 2003-124528 | 4/2003 |

* cited by examiner

SEMICONDUCTOR LIGHT-EMITTING DEVICE, LIGHTING MODULE, LIGHTING DEVICE AND METHOD FOR MANUFACTURING SEMICONDUCTOR LIGHT-EMITTING DEVICE

TECHNICAL FIELD

The present invention relates to a semiconductor light-emitting device and a lighting module and a lighting device using the same, and also relates to a method for manufacturing a semiconductor light-emitting device.

BACKGROUND ART

In general, a GaN-based light-emitting diode (hereinafter abbreviated as "LED") is composed of a semiconductor multilayer film obtained by crystal-growing a III-V group nitride semiconductor, represented by the general formula $B_zAl_xGa_{1-x-y-z}In_yN_{1-v-w}As_vP_w$ ($0 \leq x \leq 1$, $0 \leq y \leq 1$, $0 \leq z \leq 1$, $0 \leq x+y+z \leq 1$, $0 \leq v \leq 1$, $0 \leq w \leq 1$, $0 \leq v+w \leq 1$), on a single crystal substrate such as a sapphire substrate. By feeding a current through this semiconductor multilayer film, wide range of light from an ultraviolet region to an infrared region (e.g., 200 to 1700 nm) can be emitted therefrom. Especially, a LED emitting light in a wavelength region shorter than a blue-green region currently is developed eagerly.

Above all, a blue LED emitting blue light can be combined with phosphors emitting yellow light and red light by the excitation of the blue light, so as to be utilized as a white LED emitting white light. The white LED can realize a longer life as compared with an incandescent lamp and a halogen lamp, and therefore the white LED is a prospective substitute for currently-existing light sources. Alternatively, by combining several kinds of LEDs emitting ultraviolet light and near ultraviolet light with a phosphor emitting fluorescence in a wavelength region longer than blue, a white LED can be configured as well.

However, while general incandescent lamps (60 W) have a luminous flux of about 800 lm, a white LED adopting a 1 mm square of blue LED bare-chip has a luminous flux of about 30 to 60 lm. Therefore, in order to use a white LED as an illumination light source, a higher luminous flux has to be achieved. To this end, a module with a large number of white LEDs integrated therein is proposed by JP 2003-124528 A, for example. In the module proposed by JP 2003-124528 A, the white LEDs are flip-chip mounted on a mounting board without submount boards intervening therebetween. According to this mounting technology, the mounting area can be equal to the chip size, and therefore high-density mounting is enabled and a large number of white LEDs can be mounted in the mounting board having a limited size. As a result, a high luminous flux light can be obtained from the module. The module proposed by JP 2003-124528 A, however, has the following problem: since a large number of white LEDs are flip-chip mounted on the mounting board, a failure in mounting of one white LED directly leads to a defective module, thus making it difficult to improve the yield.

On the other hand, JP 2001-15817 A for example proposes a module with a large number of white LEDs mounted on a mounting board with a submount board intervening therebetween. In this module, a blue LED is flip-chip mounted on the submount board, followed by the formation of a phosphor layer on the submount board so as to cover the blue LED, whereby a semiconductor light-emitting device including a white LED is formed, and then this light-emitting device is mounted on the mounting board. Thus, the semiconductor light-emitting device can undergo the inspections of electrical or optical properties before the mounting on the mounting board, and therefore non-defective semiconductor light-emitting devices alone can be selected and mounted on the mounting board. Thereby, the yield can be improved while minimizing waste for the manufacturing process of the module.

The module proposed by JP 2001-15817 A, however, has a difficulty in densely mounting the white LEDs. Therefore, there is a possibility of a shortage in luminous flux of the light obtained from the module. Further, since the phosphor layer is formed in a substantially rectangular parallelepiped shape, the light extracted from the module has anisotropy, and therefore the extracted light may have non-uniformity in color.

DISCLOSURE OF INVENTION

In view of such circumstances, it is an object of the present invention to provide a semiconductor light-emitting device by which light extracted therefrom has less non-uniformity in color and that enables a high luminous flux and to provide a lighting module and a lighting device using this semiconductor light-emitting device and a manufacturing method of the semiconductor light-emitting device.

The semiconductor light-emitting device of the present invention includes: a semiconductor multilayer film in which a first conductivity type layer, a light-emitting layer and a second conductivity type layer are laminated in this stated order, the second conductivity type layer being disposed on an extraction side of light emitted from the light-emitting layer; a first electrode contacting with the first conductivity type layer; a second electrode contacting with the second conductivity type layer; a substrate disposed on a side of the first conductivity type layer of the semiconductor multilayer film and supporting the semiconductor multilayer film; first and second terminals formed on a rear face with respect to a principal surface of the substrate on a side of the semiconductor multilayer film; a first conductive member that electrically connects the first electrode with the first terminal; a second conductive member that electrically connects the second electrode with the second terminal; and a phosphor layer formed on the substrate so as to cover the semiconductor multilayer film, the phosphor layer absorbing the light emitted from the light-emitting layer so as to emit fluorescence. The phosphor layer has an outer edge of a cross section taken in a direction parallel to the principal surface of the substrate on the semiconductor multilayer film side, the outer edge having a substantially circular shape or a substantially regular polygonal shape having five or more sides. An outer edge of the principal surface of the substrate on the semiconductor multilayer film side is formed in a substantially circular shape or a substantially regular polygonal shape having five or more sides.

A lighting module of the present invention includes the above-stated semiconductor light-emitting device and a mounting board for mounting the semiconductor light-emitting device. A lighting device of the present invention includes the above-stated lighting module as a light source.

A first manufacturing method of a semiconductor light-emitting device of the present invention includes the steps of:

forming a semiconductor multilayer film on one principal surface of a single crystal substrate so that the semiconductor multilayer film includes a first conductivity type layer, a light-emitting layer and a second conductivity type layer in order of increasing proximity to the single crystal substrate, the second conductivity type layer being disposed on an extraction side of light emitted from the light-emitting layer;

forming first and second electrodes contacting with the first and the second conductivity type layers, respectively;

aside from the above steps, providing via holes in a substrate and then forming via conductors in the via holes;

forming conductive patterns on one principal surface of the substrate so as to electrically connect with the via conductors;

forming first and second terminals on a rear face of the substrate with respect to the principal surface so as to electrically connect with the conductive patterns through the via conductors;

electrically connecting the first electrode with the first terminal through one of the conductive patterns and one of the via conductors, and electrically connecting the second electrode with the second terminal through another conductive pattern and another via conductor;

forming on the substrate a phosphor layer absorbing the light emitted from the light-emitting layer to emit fluorescence so as to cover the semiconductor multilayer film and so that an outer edge of a cross section of the phosphor layer taken in a direction parallel to the principal surface of the substrate on the semiconductor multilayer film side has a substantially circular shape or a substantially regular polygonal shape having five or more sides; and cutting the substrate into a substantially circular shape or a substantially regular polygonal shape having five or more sides so as to surround a region of the substrate on which the phosphor layer is formed.

A second manufacturing method of a semiconductor light-emitting device of the present invention includes the steps of:

forming a semiconductor multilayer film on one principal surface of a single crystal substrate so that the semiconductor multilayer film includes a first conductivity type layer, a light-emitting layer and a second conductivity type layer in order of increasing proximity to the single crystal substrate, the second conductivity type layer being disposed on an extraction side of light emitted from the light-emitting layer;

forming a first electrode contacting with a principal surface of the first conductivity type layer;

aside from the above steps, providing via holes in a substrate and then forming via conductors in the via holes;

forming a conductive pattern on one principal surface of the substrate so as to electrically connect with one of the via conductors;

forming a metal layer on the conductive pattern;

bonding the first electrode and the metal layer so as to form a laminate in which the semiconductor multilayer film is sandwiched between the single crystal substrate and the substrate;

detaching the single crystal substrate from the semiconductor multilayer film;

forming a second electrode that electrically connects the second conductivity type layer with another via conductor;

forming on a rear face of the substrate with respect to the principal surface a first terminal that electrically connects with the conductive pattern through the corresponding via conductor and a second terminal that electrically connects with the second electrode through the corresponding via conductor;

forming on the substrate a phosphor layer absorbing the light emitted from the light-emitting layer to emit fluorescence so that the phosphor layer contacts with a principal surface of the second conductivity type layer and covers the semiconductor multilayer film and so that an outer edge of a cross section of the phosphor layer taken in a direction parallel to the principal surface of the substrate on the semiconductor multilayer film side has a substantially circular shape or a substantially regular polygonal shape having five or more sides; and cutting the substrate into a substantially circular shape or a substantially regular polygonal shape having five or more sides that surrounds a region of the substrate on which the phosphor layer is formed.

DESCRIPTION OF THE INVENTION

Figure 1A:
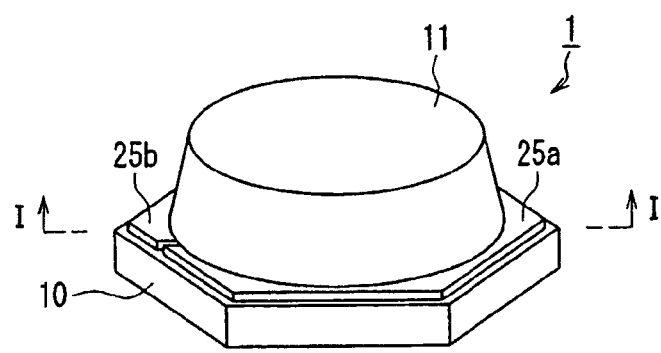
FIG. 1A is a perspective view of a semiconductor light-emitting device according to Embodiment 1 of the present invention.

The semiconductor light-emitting device of the present invention includes: a semiconductor multilayer film in which a first conductivity type layer, a light-emitting layer and a second conductivity type layer are laminated in this stated order, the second conductivity type layer being disposed on an extraction side of light emitted from the light-emitting layer; a first electrode contacting with the first conductivity type layer; a second electrode contacting with the second conductivity type layer; a substrate disposed on a side of the first conductivity type layer of the semiconductor multilayer film and supporting the semiconductor multilayer film; first and second terminals formed on a rear face with respect to a principal surface of the substrate on a side of the semiconductor multilayer film; a first conductive member that electrically connects the first electrode with the first terminal; a second conductive member that electrically connects the second electrode with the second terminal; and a phosphor layer formed on the substrate so as to cover the semiconductor multilayer film, the phosphor layer absorbing the light emitted from the light-emitting layer so as to emit fluorescence.

The semiconductor multilayer film has a structure in which the first conductivity type layer, the light-emitting layer and the second conductivity type layer are laminated in this stated order. Such a structure includes a diode structure configuring a blue LED for example. The first conductivity type layer is a p-type or n-type semiconductor layer. As the first conductivity type layer, a p-GaN layer as the p-type semiconductor layer or a n-GaN layer as the n-type semiconductor layer can be used for example. As a material of the light-emitting layer, a material capable of emitting light of 450 to 470 nm. is preferable. A specific example of the light-emitting layer includes an InGaN/GaN quantum well light-emitting layer for example. The second conductivity type layer may be a semiconductor layer of a conductivity type opposite to that of the first conductivity type layer. For instance, in the case where the first conductivity type layer is a p-type semiconductor layer, the semiconductor conductivity type layer is a n-type semiconductor layer. As the second conductivity type layer, like the first conductivity type layer, a p-GaN layer as the p-type semiconductor layer or a n-GaN layer as the n-type semiconductor layer can be used for example. Thicknesses of the p-type semiconductor layer, the light-emitting layer and the n-type semiconductor layer may be 0.1 to 0.5 μm, 0.01 to 0.1 μm and 0.5 to 3 μm, respectively, for example. Note here that each of the first conductivity type layer, the light-emitting layer and the second conductivity type layer may be a single layer or may include a plurality of layers. In the case of including a plurality of layers, they may be made of different materials. The semiconductor light-emitting device of the present invention further may include a single crystal substrate (thickness: 0.01 to 0.5 mm), which is used for crystal-growth of the semiconductor multilayer film, disposed contacting with the principal surface of the first conductivity type layer or the principal surface of the second conductivity type layer.

Although materials of the first and the second electrodes are not limited especially, the first electrode formed contacting with the first conductivity type layer preferably is made of a material capable of reflecting light emitted from the light-emitting layer. This is for enhancing the light extraction efficiency of the semiconductor light-emitting device. As the material capable of reflecting the light emitted from the light-emitting layer, Rh/Pt/Au can be exemplified for example. Thicknesses of the first and the second electrodes may be 0.5 to 3 μm, for example.

The substrate is not limited especially, and semiconductor substrates such as a Si substrate and a SiC substrate and ceramic substrates such as an $Al_2O_3$ substrate and an AlN substrate can be used for example. Among them, a high purity Si substrate is preferable because it has a high thermal conductivity and a good processability. A thickness of the substrate may be 0.1 to 1 mm for example. Note here that as the substrate, a conductive substrate made of metal or conductive semiconductor in which desired positions are coated with an electrical insulating material such as $SiO_2$ or SiN may be used.

The first and the second terminals are for establishing connection with a mounting board when the semiconductor light-emitting device of the present invention is mounted to the mounting board so as to manufacture a lighting module. As materials of the first and the second terminals, a conventional conductive material such as Ti/Au can be used for example. Thicknesses of the first and the second terminals may be 0.5 to 3 μm, for example.

As the first and the second conductive members, via conductors formed in via holes provided in the substrate and conductive patterns formed on the principal surface of the substrate on the semiconductor multilayer film side can be exemplified. If the first and the second conductive members include the via conductors, when a lighting module is manufactured, the semiconductor light-emitting device can be mounted densely to a mounting board. When the via conductors are provided in the substrate, they may be provided at portions (e.g., ends of the substrate) other than immediately below the portion where the semiconductor multilayer film is provided. If via conductors are formed immediately below the portion where the semiconductor multilayer film is provided, the via conductors and the semiconductor multilayer film may be deformed during the mounting of the semiconductor multilayer film. In order to form the via conductors, the via holes may be filled with a metal material such as Pt or Cu by plating or the like, for example. The diameter of the via conductors may be 20 to 200 µm, for example. Herein, instead of the via conductors, conductors may be provided along a side face of the substrate. In the case where the first and the second conductive members include the conductive patterns, the conductive patterns may include a material (e.g., Ti/Pt/Al) capable of reflecting light emitted from the light-emitting layer or light emitted from the phosphor layer, and the conductive patterns may be formed on the substantially entire surface of the principal surface of the substrate on the semiconductor multilayer film side. With this configuration, light traveling from the light-emitting layer and the phosphor layer to the substrate can be reflected toward the light extraction side using these conductive patterns, whereby the light extraction efficiency can be enhanced. The thickness of the conductive patterns may be 0.5 to 3 µm for example.

The phosphor layer includes phosphors capable of absorbing light emitted from the light-emitting layer and emitting fluorescence (e.g., fluorescence of yellow light and red light). As the phosphor emitting yellow light, $(Sr, Ba)_2SiO_4:Eu^{2+}$, $(Y, Gd)_3Al_5O_{12}:Ce^{3+}$ and the like can be exemplified. As the phosphor emitting red light, $(Ca, Sr)S:Eu^{2+}$, $Sr_2Si_5N_8:Eu^{2+}$ and the like can be exemplified. The phosphor layer may be formed on the substrate so as to cover the semiconductor multilayer film. With this configuration, in the case where the light emitted from the light-emitting layer is blue light, this blue light is absorbed into the phosphors in the phosphor layer, and the phosphors emit yellow light and red light. Then, the yellow light and the red light emitted from the phosphors and the blue light emitted from the light-emitting layer and passing through the phosphor layer are mixed with each other, whereby illumination light can be extracted as white light for example. The average thickness of the phosphor layer may be 0.03 to 1 mm for example.

The phosphor layer in the semiconductor light-emitting device of the present invention has an outer edge of a cross section taken in a direction parallel to the principal surface of the substrate on the semiconductor multilayer film side, the outer edge having a substantially circular shape or a substantially regular polygonal shape having five or more sides. With this configuration, the semiconductor light-emitting device of the present invention can reduce anisotropy of the light emitted from the phosphor layer and suppress non-uniformity in color of the extracted light. According to the semiconductor light-emitting device of the present invention, an outer edge of the principal surface of the substrate on the semiconductor multilayer film side is formed in a substantially circular shape or a substantially regular polygonal shape having five or more sides. With this configuration, the semiconductor light-emitting device of the present invention permits the high-density formation of the phosphor layer on the electrical insulating substrate, thus enabling a higher luminous flux.

In the semiconductor light-emitting device of the present invention, the outer edge of the principal surface of the substrate on the semiconductor multilayer film side may be formed in a substantially regular hexagonal shape. This configuration can facilitate the processing of the outer shape of the substrate during the manufacturing process of the semiconductor light-emitting device.

In the semiconductor light-emitting device of the present invention, the first electrode may be formed contacting with a principal surface of the first conductivity type layer, and the phosphor layer may be formed contacting with a principal surface of the second conductivity type layer. With this configuration, since there is no single crystal substrate on the principal surface of the semiconductor multilayer film that is used for crystal-growth of the semiconductor multilayer film, a thin semiconductor light-emitting device can be configured as a whole. Moreover, the light emitted from the light-emitting layer can be released without passing through the single crystal substrate, and therefore the light extraction efficiency can be enhanced.

In the semiconductor light-emitting device of the present invention, the phosphor layer may be formed in a substantially truncated cone shape or a substantially hemispherical shape. With this configuration, spot light symmetric with respect to a point can be obtained therefrom, and therefore a light source suitable for lighting devices can be provided.

In the semiconductor light-emitting device of the present invention, an outermost edge of the semiconductor multilayer film may be formed in a substantially circular shape or a substantially regular polygonal shape having five or more sides. With this configuration, anisotropy of the light emitted from the phosphor layer can be reduced, so that non-uniformity in color of the extracted light further can be suppressed. Note here that "the outermost edge" refers to one maximizing an area of the region surrounded therewith.

The lighting module of the present invention includes the above-stated semiconductor light-emitting device and a mounting board for mounting the semiconductor light-emitting device. The lighting device of the present invention includes the above-stated lighting module as a light source. In this way, each of the lighting module and the lighting device of the present invention includes the semiconductor light-emitting device of the present invention, and therefore non-uniformity in color of the extracted light can be suppressed and a higher luminous flux can be obtained.

The first manufacturing method of a semiconductor light-emitting device of the present invention is one example of preferred methods for manufacturing the above-stated semiconductor light-emitting device of the present invention. Hence, materials of the respective elements and the like described below are the same as those in the above-described semiconductor light-emitting device of the present invention.

According to the first manufacturing method of a semiconductor light-emitting device of the present invention, firstly, a semiconductor multilayer film is formed on one principal surface of a single crystal substrate such as a GaN substrate so that the semiconductor multilayer film includes a first conductivity type layer, a light-emitting layer and a second conductivity type layer in order of increasing proximity to the single crystal substrate, the second conductivity type layer being disposed on an extraction side of light emitted from the light-emitting layer. For instance, the second conductivity type layer, the light-emitting layer and the first conductivity type layer may be laminated successively on the principal surface of the single crystal substrate by metal-organic chemical vapor deposition (MOCVD) or the like.

Next, first and second electrodes are formed contacting with the first and the second conductivity type layers, respectively. For instance, electrode layers such as a Rh/Pt/Au layer and a Ti/Pt/Au layer may be formed at desired positions on the first and the second conductivity type layers by electron-beam evaporation or the like.

Then, aside from the above steps, via holes are provided in a substrate by dry etching or the like and then via conductors are formed in the via holes. The via conductors may be formed by filling the via holes with metal such as Pt by plating or the like. Next, conductive patterns are formed on one principal surface of the substrate so as to electrically connect with the via conductors. For instance, the conductive patterns can be formed by forming a metal film such as a Ti/Pt/Al film on the principal surface of the substrate by evaporation or the like, followed by patterning of this metal film into a predetermined shape by lift-off technique or the like. Following this, first and second terminals are formed on a rear face of the substrate with respect to the principal surface with the conductive patterns formed thereon so as to electrically connect with the conductive patterns through the via conductors. For instance, the first and the second terminals can be formed by forming a primary film including a Ti/Au thin film by electron-beam evaporation or the like at portions where the via conductors are exposed on the rear face of the substrate, followed by the lamination of an Au layer on this primary film by plating or the like.

Following this, the first electrode is connected electrically with the first terminal through one of the conductive patterns and one of the via conductors, and the second electrode is electrically connected with the second terminal through another conductive pattern and another via conductor. As a result, the semiconductor multilayer film can be supported by the substrate. For instance, the first electrode and the conductive pattern may be connected electrically via a bump, and the second electrode and the conductive pattern may be connected via a bump.

Next, a phosphor layer absorbing the light emitted from the light-emitting layer to emit fluorescence is formed on the substrate so as to cover the semiconductor multilayer film and so that an outer edge of a cross section of the phosphor layer taken in a direction parallel to the principal surface of the substrate on the semiconductor multilayer film side has a substantially circular shape or a substantially regular polygonal shape having five or more sides. For instance, the phosphor layer may be formed by screen-printing a paste including a resin composition containing the phosphors and a silicone resin at a position covering the semiconductor multilayer film on the substrate using a screen having pores corresponding to the shape of a substantially truncated cone shape, a substantially truncated regular polygonal pyramid shape or the like.

Then, the substrate is cut into a substantially circular shape or a substantially regular polygonal shape having five or more sides so as to surround a region of the substrate on which the phosphor layer is formed. As a means for cutting out the substrate, a dicing blade can be used for example. With the above-stated method, the semiconductor light-emitting device of the present invention can be manufactured easily.

The second manufacturing method of a semiconductor light-emitting device of the present invention is another example of preferred methods for manufacturing the above-stated semiconductor light-emitting device of the present invention. Hence, materials of the respective elements and the like described below are the same as those in the above-described semiconductor light-emitting device of the present invention.

According to the second manufacturing method of a semiconductor light-emitting device of the present invention, firstly, a semiconductor multilayer film is formed on one principal surface of a single crystal substrate such as a sapphire substrate so that the semiconductor multilayer film includes a first conductivity type layer, a light-emitting layer and a second conductivity type layer in order of increasing proximity to the single crystal substrate, the second conductivity type layer being disposed on an extraction side of light emitted from the light-emitting layer. For instance, the second conductivity type layer, the light-emitting layer and the first conductivity type layer may be laminated successively on the principal surface of the single crystal substrate by MOCVD or the like. Following this, a first electrode is formed contacting with a principal surface of the first conductivity type layer. For instance, an electrode layer such as a Rh/Pt/Au layer may be formed at desired positions on the first conductivity type layer by electron-beam evaporation or the like.

Then, aside from the above steps, via holes are provided in a substrate by dry etching or the like and then via conductors are formed in the via holes. For instance, the via conductors may be formed by filling the via holes with metal such as Pt by plating or the like. Next, a conductive pattern is formed on one principal surface of the substrate so as to electrically connect with one of the via conductors. For instance, the conductive pattern can be formed by forming a metal film such as a Ti/Pt/Au film on the principal surface of the substrate by evaporation or the like, followed by patterning of this metal film into a predetermined shape by lift-off technique or the like. Next, a metal layer such as an Au/Sn layer is formed on the conductive pattern by plating or the like. A thickness of this metal layer may be 0.5 to 3 µm, for example.

Then, the first electrode and the metal layer are heated at a temperature for allowing the metal layer to melt (in the case where the metal layer is an Au/Su layer, about 300° C.) and are bonded with each other, whereby a lamination member is formed in which the semiconductor multilayer film is sandwiched between the single crystal substrate and the substrate.

Then, the single crystal substrate is detached from the semiconductor multilayer film. For instance, the bonding force at an interface between the single crystal substrate and the semiconductor multilayer film may be decreased by irradiation with a laser beam from the side of the single crystal substrate, and then the single crystal substrate may be detached from the semiconductor multilayer film. As the laser beam, a YAG laser with a wavelength of 355 nm, a KrF excimer laser with a wavelength of 248 nm can be used for example.

Next, a second electrode is formed so as to electrically connect the second conductivity type layer with another via conductor. For instance, the second electrode may be formed by forming a metal film such as a Ti/Pt/Al film by evaporation or the like at a connecting portion of the second conductivity type layer and the via conductor. Then, on a rear face of the substrate with respect to the principal surface on which the conductive pattern is formed, a first terminal is formed so as to electrically connect with the conductive pattern through the corresponding via conductor and a second terminal is formed so as to electrically connect with the second electrode through the corresponding via conductor. For instance, the first and the second terminals can be formed by forming a primary film including a Ti/Au thin film by electron-beam evaporation or the like at portions where the via conductors are exposed on the rear face of the substrate, followed by the lamination of an Au layer on this primary film by plating or the like.

Next, a phosphor layer absorbing the light emitted from the light-emitting layer to emit fluorescence is formed on the substrate so that the phosphor layer contacts with a principal surface of the second conductivity type layer and covers the semiconductor multilayer film and so that an outer edge of a cross section of the phosphor layer taken in a direction parallel to the principal surface of the substrate on the semiconductor multilayer film side has a substantially circular shape or a substantially regular polygonal shape having five or more sides. For instance, the phosphor layer may be formed by screen-printing a paste including a resin composition containing the phosphors and a silicone resin at a position covering the semiconductor multilayer film on the substrate using a screen having pores corresponding to the shape of a substantially truncated cone shape, a substantially truncated regular polygonal pyramid shape or the like.

Then, the substrate is cut into a substantially circular shape or a substantially regular polygonal shape having five or more sides so as to surround a region of the substrate on which the phosphor layer is formed. As a means for cutting the substrate, a dicing blade can be used for example. With the above-stated method, the semiconductor light-emitting device of the present invention can be manufactured easily. The following describes embodiments of the present invention in detail.

Embodiment 1

Firstly, a semiconductor light-emitting device according to Embodiment 1 of the present invention will be described with reference to the drawings. FIG. 1 to be referred to herein is for explaining the semiconductor light-emitting device according to Embodiment 1, where FIG. 1A is a perspective view of the semiconductor light-emitting device according to Embodiment 1, FIG. 1B is a cross-sectional view taken along the line I-I of FIG. 1A and FIG. 1C is a schematic plan view of the semiconductor light-emitting device according to Embodiment 1 when viewing from its phosphor layer side.

The semiconductor light-emitting device 1 according to Embodiment 1, as shown in FIGS. 1A and B, includes: an electrical insulating substrate 10 formed in a substantially regular hexagonal prism shape; a phosphor layer 11 provided on the electrical insulating substrate 10 and formed in a substantially truncated cone shape; a semiconductor multilayer film 12 provided on the electrical insulating substrate 10; and a single crystal substrate 13 contacting with the semiconductor multilayer film 12 and used for crystal-growth of the semiconductor multilayer film 12. The semiconductor multilayer film 12 and the single crystal substrate 13 are covered with the phosphor layer 11. A principal surface 13a of the single crystal substrate 13 as a surface contacting with the phosphor layer 11 is processed to have convexo-concave irregularities. This concave and convex structure improves the light extraction efficiency of the semiconductor light-emitting device 1. Herein, the concave and convex structure formed in the principal surface 13a may have a depth of 0.1 to 50 μm, for example, and a pitch of the convexes may be 0.5 to 500 μm, for example.

Figure 1B:
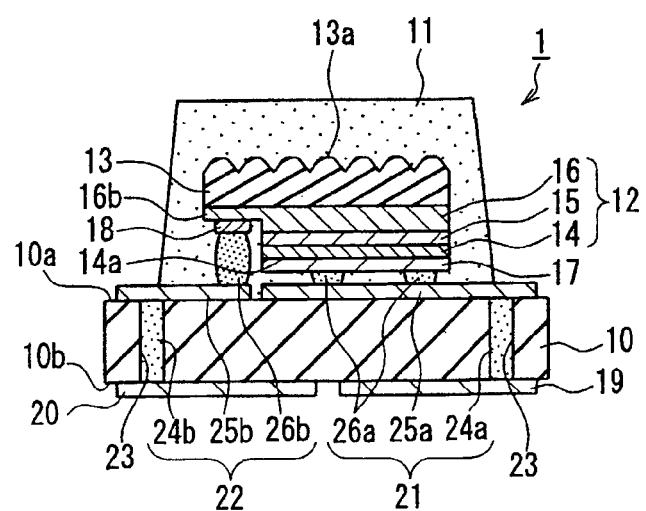
FIG. 1B is a cross-sectional view taken along the line I-I of FIG. 1A
Figure 1C:
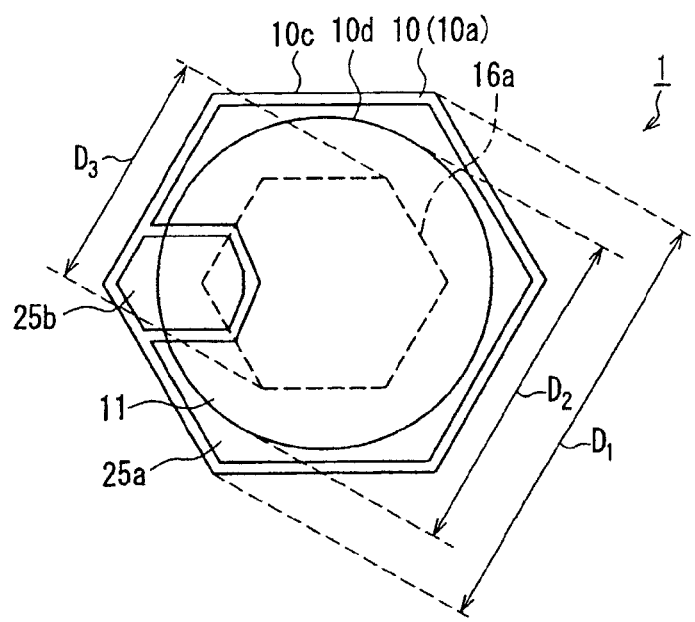
FIG. 1C is a schematic plan view of the semiconductor light-emitting device according to Embodiment 1 of the present invention when viewing from its phosphor layer side.

The semiconductor multilayer film 12, as shown in FIG. 1B, is composed of a first conductivity type layer 14 made of a p-type semiconductor, for example, a light-emitting layer 15 and a second conductivity type layer 16 made of a n-type semiconductor, for example, which are laminated in this stated order from the side of the electrical insulating substrate 10 to have a diode structure. The second conductivity type layer 16 is disposed on the light-extraction side of the light emitted from the light-emitting layer 15. As shown in FIG. 1C, the outer edge 16a of the second conductivity type layer 16 that is the outermost edge of the semiconductor multilayer film 12 (see FIG. 1B) is formed in a substantially regular hexagonal shape. Note here that the phosphor layer 11 contains a phosphor capable of absorbing light emitted from the light-emitting layer 15 and emitting fluorescence.

Besides the above-stated configuration, the semiconductor light-emitting device 1 includes, as shown in FIG. 1B: a first electrode 17 formed on a principal surface 14a of the first conductivity type layer 14; a second electrode 18 formed on a protrusion 16b of the second conductivity type layer 16; a first terminal 19 and a second terminal 20 formed on a rear face 10b of the electrical insulating substrate 10 with respect to a principal surface 10a on the side of the semiconductor multilayer film 12; a first conductive member 21 that electrically connects the first electrode 17 with the first terminal 19; and a second conductive member 22 that electrically connects the second electrode 18 with the second terminal 20.

The first conductive member 21 includes: a via conductor 24a that contacts with the first terminal 19 and is formed in a via hole 23 provided in the electrical insulating substrate 10; a conductive pattern 25a that contacts with the via conductor 24a and is formed on the principal surface 10a of the electrical insulating substrate 10; and a bump 26a that electrically connects the conductive pattern 25a with the first electrode 17. The second conductive member 22 includes: a via conductor 24b that contacts with the second terminal 20 and is formed in a via hole 23 provided in the electrical insulating substrate 10; a conductive pattern 25b that contacts with the via conductor 24b and is formed on the principal surface 10a of the electrical insulating substrate 10; and a bump 26b that electrically connects the conductive pattern 25b with the second electrode 18. The conductive patterns 25a and 25b include a material that reflects light, and are formed substantially on the entire surface of the principal surface 10a of the electrical insulating substrate 10 as shown in FIG. 1C. With this configuration, the semiconductor light-emitting device 1 allows light traveling from the light-emitting layer 15 and the phosphor layer 11 to the electrical insulating substrate 10 side to be reflected toward the light extraction side using the conductive patterns 25a and 25b, whereby the light extraction efficiency can be enhanced.

Since the phosphor layer 11 is formed in a substantially truncated cone shape as previously described, the outer edge of a cross section of the phosphor layer 11 taken in the direction parallel to the principal surface 10a of the electrical insulating substrate 10 has a substantially circular shape. With this configuration, the semiconductor light-emitting device 1 can reduce anisotropy of the light emitted from the phosphor layer 11 and suppress non-uniformity in color of the extracted light, and spot light symmetric with respect to a point can be obtained therefrom. Therefore, such a semiconductor light-emitting device can serve as a light source suitable for lighting devices. Further, since the electrical insulating substrate 10 is formed in a substantially regular hexagonal prism shape as previously described, the outer edge 10c of the principal surface 10a, formed in a substantially regular hexagonal shape, surrounds a region 10d of the electrical insulating substrate 10 in which the phosphor layer 11 is formed as shown in FIG. 1C. With this configuration, the semiconductor light-emitting device 1 permits the high-density formation of the phosphor layer 11 on the electrical insulating substrate 10, thus enabling a higher luminous flux and facilitating the processing of the outer shape of the electrical insulating substrate 10 during the manufacturing process of the semiconductor light-emitting device 1, which will be described later.

Herein, regarding the outer edge 10c of the principal surface 10a of the electrical insulating substrate 10, the length $D_1$ of the diagonal line (see FIG. 1C) may be 0.5 to 5 mm, for example. The radius $D_2$ of the region 10d (see FIG. 1C) in which the phosphor layer 11 is formed on the electrical insulating substrate 10 may be 0.4 to 4.5 mm, for example. Regarding the outer edge 16a of the second conductivity type layer 16, the length $D_3$ of the diagonal line (see FIG. 1C) may be 0.2 to 4 mm, for example.

When light is extracted from the thus configured semiconductor light-emitting device 1, a voltage is applied between the first terminal 19 and the second terminal 20 so that a predetermined current flows through the semiconductor light-emitting device 1. Thereby, blue light with a wavelength of 460 nm, for example, can be emitted from the light-emitting layer 15. Then, this blue light is absorbed by the phosphors in the phosphor layer 11, so that the phosphors emit yellow light and red light. Then, the yellow light and the red light emitted from the phosphors are mixed with the blue light emitted form the light-emitting layer 15 and passing through the phosphor layer 11, whereby white light, for example, can be extracted as illumination light.

That is the explanation for the semiconductor light-emitting device according to Embodiment 1 of the present invention, but the semiconductor light-emitting device of the present invention is not limited to the above-stated embodiment. For instance, a semiconductor light-emitting device including a plurality of semiconductor multilayer films disposed on one substrate also is possible. The shape of the outermost edge of the semiconductor multilayer film is not limited to the above-stated embodiment, and a quadrangular shape also is possible, for example.

Figure 6:
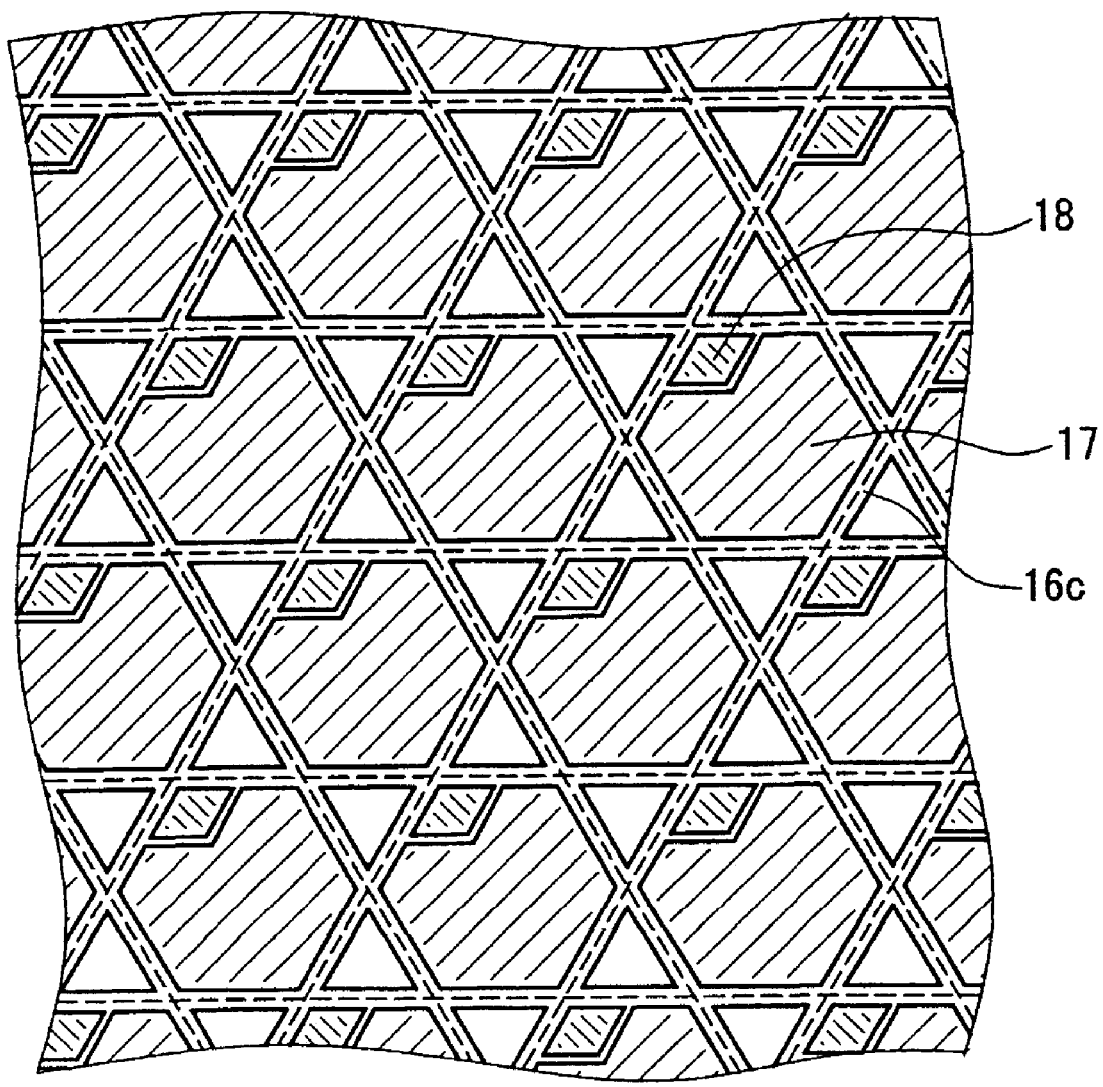
FIG. 6 is a top view of the step for dividing the semiconductor multilayer film that is used for the semiconductor light-emitting device according to Embodiment 1 of the present invention into individual pieces.
Figure 7:
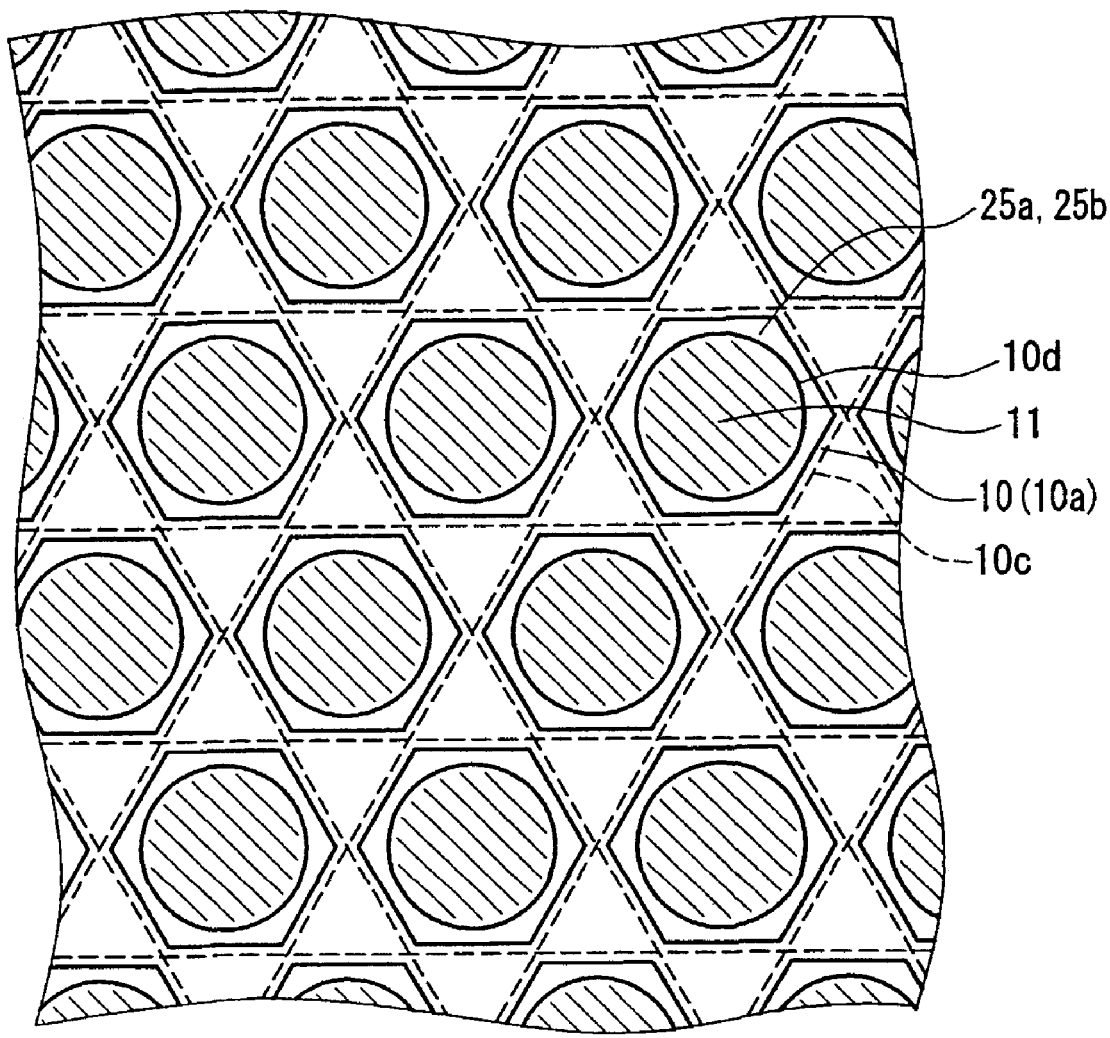
FIG. 7 is a top view of the step for dividing into individual pieces of semiconductor light-emitting devices according to Embodiment 1 of the present invention.

The following describes a method for manufacturing the semiconductor light-emitting device 1 according to Embodiment 1 of the present invention, with reference to the drawings as required. FIG. 2 to FIG. 7 to be referred to herein are for explaining a method for manufacturing the semiconductor light-emitting device 1 according to Embodiment 1, where FIG. 2 to FIG. 5 are cross-sectional views showing the steps of the manufacturing method of the semiconductor light-emitting device 1 according to Embodiment 1, and FIG. 6 is a top view of the step for dividing the semiconductor multilayer film 12 into individual pieces, and FIG. 7 is a top view of the step for dividing into individual pieces of semiconductor light-emitting devices 1. Note here that the same reference numerals are assigned to the same elements as those in FIGS. 1A to C and their explanations are omitted. The manufacturing method described below is one illustrative example according to the above-described first manufacturing method of the semiconductor light-emitting device of the present invention.

Figure 2A:
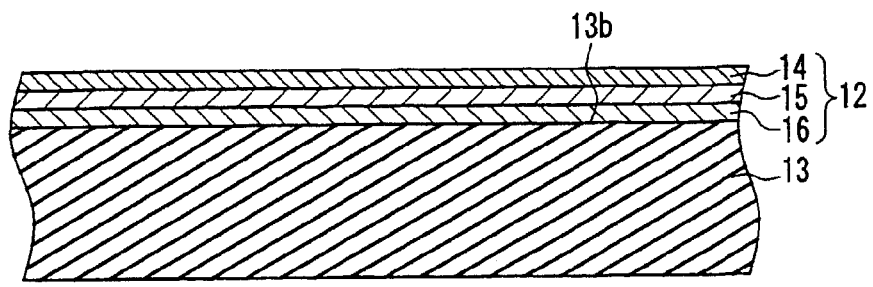
FIGS. 2A to D are cross-sectional views showing the steps of a manufacturing method of the semiconductor light-emitting device according to Embodiment 1 of the present invention.

Firstly, as shown in FIG. 2A, a second conductivity type layer 16, a light-emitting layer 15 and a first conductivity type layer 14 are laminated successively on a principal surface 13b of a single crystal substrate 13 by MOCVD technique or the like so as to form a semiconductor multilayer film 12. As the single crystal substrate 13, a GaN substrate with a thickness of about 300 μm can be used, for example.

Figure 2B:
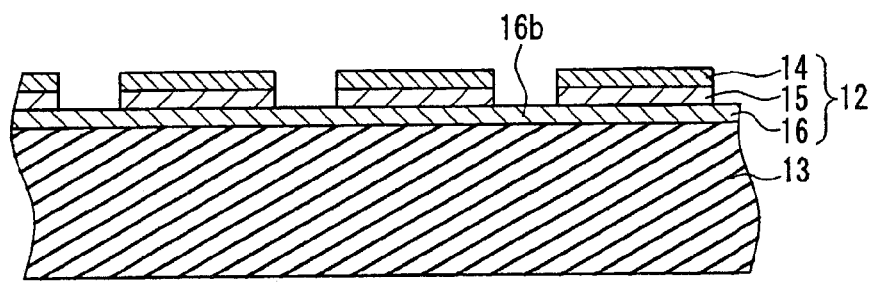

Following this, as shown in FIG. 2B, a part of the first conductivity type layer 14 and a part of the light-emitting layer 15 are etched by dry-etching or the like, so as to form a protrusion 16b of the second conductivity type layer 16.

Figure 2C:
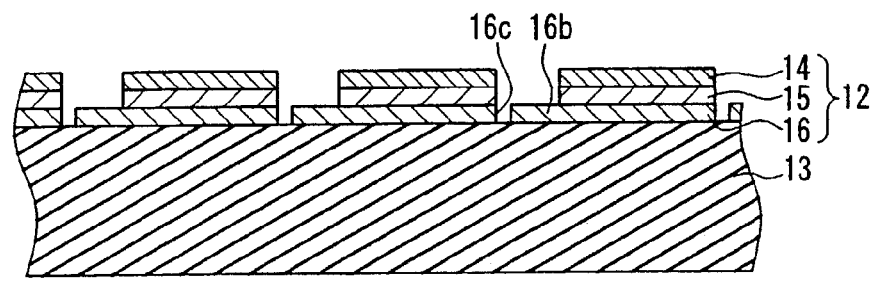

Following this, as shown in FIG. 2C, a part of the second conductivity type layer 16 is etched by dry-etching or the like, so as to form a dividing groove 16c for dividing the semiconductor multilayer film 12 into individual pieces.

Figure 2D:
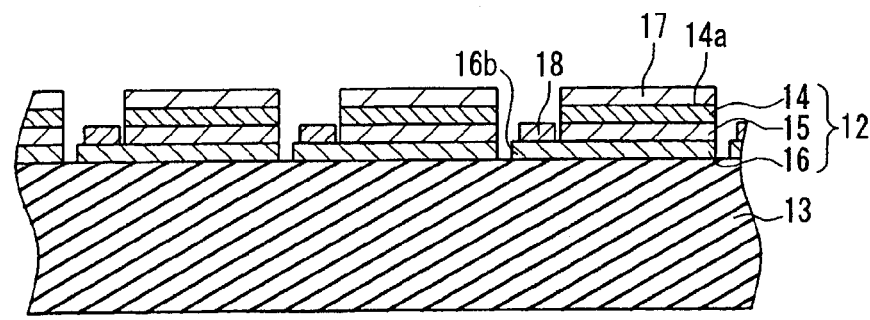

Following this, as shown in FIG. 2D, a first electrode 17 and a second electrode 18 are formed by electron-beam evaporation or the like so as to contact with a principal surface 14a of the first conductivity type layer 14 and the protrusion 16b of the second conductivity type layer 16, respectively.

Figure 3A:
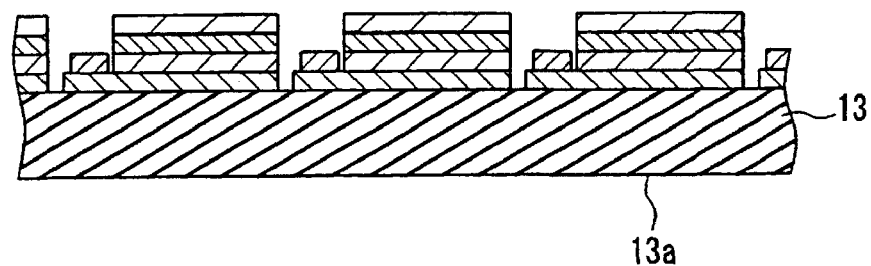
FIGS. 3A to C are cross-sectional views showing the steps of a manufacturing method of the semiconductor light-emitting device according to Embodiment 1 of the present invention.

Next, as shown in FIG. 3A, a principal surface 13a of the single crystal substrate 13 is ground by mechanical grinding or the like so that the single crystal substrate 13 has a thickness of about 200 μm.

Figure 3B:
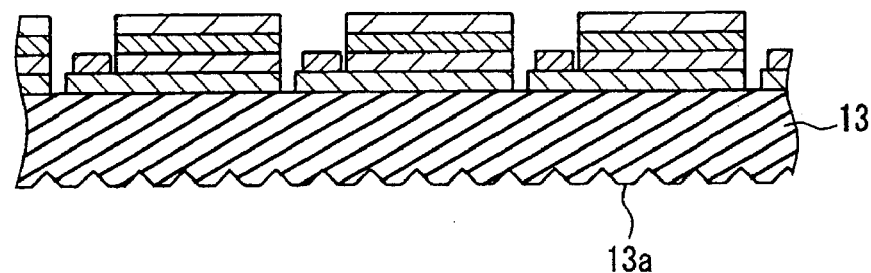

Following this, as shown in FIG. 3B, the principal surface 13a of the single crystal substrate 13 is processed to have convexo-concave irregularities by means of dry etching or the like. Thereby, the light extraction efficiency of the formed semiconductor light-emitting device 1 can be enhanced.

Figure 3C:
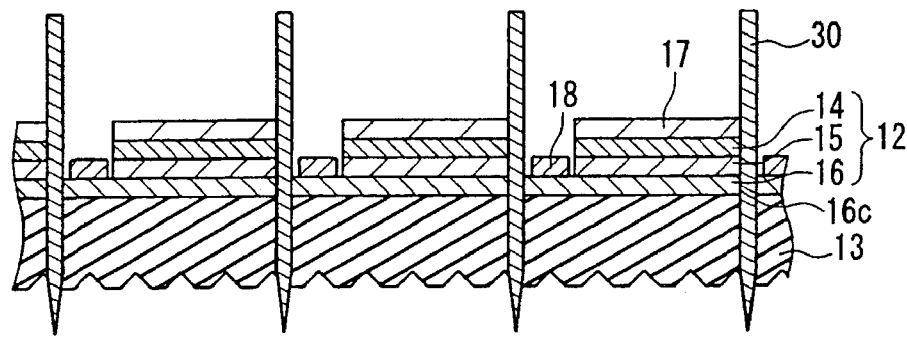

Following this, as shown in FIG. 3C, the semiconductor multilayer film 12 is divided into individual pieces along the dividing grooves 16c using a dicing blade 30. Herein, the dividing grooves 16c may be provided along the broken lines shown in FIG. 6.

Figure 4A:
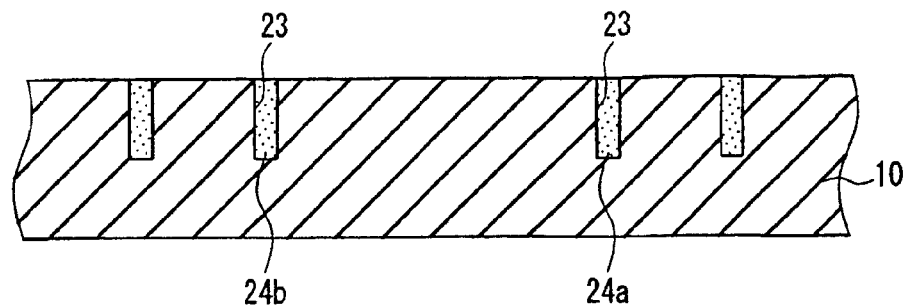
FIGS. 4A to D are cross-sectional views showing the steps of a manufacturing method of the semiconductor light-emitting device according to Embodiment 1 of the present invention.

Then, aside from this, via holes 23 are provided in an electrical insulating substrate 10 by means of dry etching or the like as shown in FIG. 4A, and then via conductors 24a and 24b are formed in these via holes 23. The via conductors 24a and 24b may be formed by filling the via holes 23 with metal such as Pt by plating or the like. Herein, as the electrical insulating substrate 10, a high purity Si substrate with a thickness of about 300 μm can be used for example.

Figure 4B:
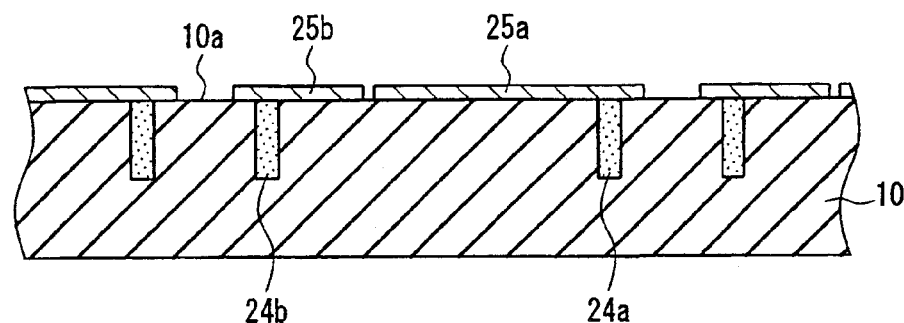

Following this, as shown in FIG. 4B, conductive patterns 25a and 25b are formed on a principal surface 10a of the electrical insulating substrate 10 so as to electrically connect with the via conductors 24a and 24b, respectively. For instance, the conductive patterns 25a and 25b can be formed by forming a metal film such as a Ti/Pt/Al film on the principal surface 10a of the electrical insulating substrate 10 by evaporation or the like, followed by patterning of this metal film into a predetermined shape by lift-off technique or the like.

Figure 4C:
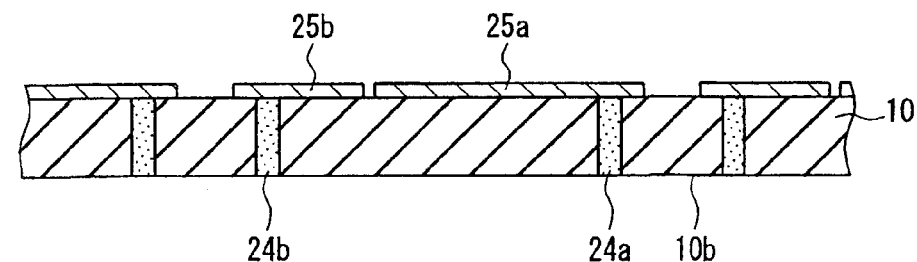

Following this, as shown in FIG. 4C, a rear face 10b of the electrical insulating substrate 10 is ground by mechanical grinding or the like so that the via conductors 24a and 24b are exposed. For instance, the grinding can be performed so that the electrical insulating substrate 10 has a thickness of about 200 μm.

Figure 4D:
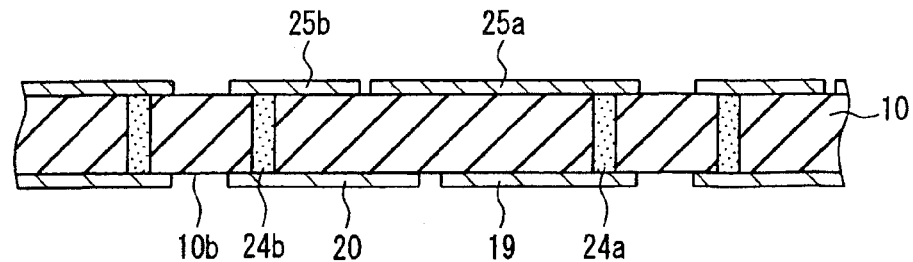

Following this, as shown in FIG. 4D, on the rear face 10b of the electrical insulating substrate 10, a first terminal 19 is formed so as to electrically connect with the conductive pattern 25a through the via conductor 24a and a second terminal 20 is formed so as to electrically connect with the conductive pattern 25b through the via conductor 24b. For instance, the first and the second terminals 19 and 20 can be formed by forming a primary film including a Ti/Au thin film by electron-beam evaporation or the like at portions where the via conductors 24a and 24b are exposed on the rear face 10b of the electrical insulating substrate 10, followed by the lamination of an Au layer on this primary film by plating or the like.

Figure 5A:
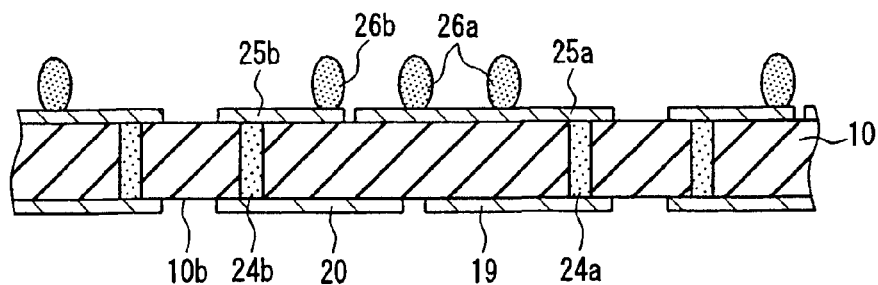
FIGS. 5A to D are cross-sectional views showing the steps of a manufacturing method of the semiconductor light-emitting device according to Embodiment 1 of the present invention.

Next, as shown in FIG. 5A, bumps 26a and 26b are formed on the conductive patterns 25a and 25b, respectively.

Figure 5B:
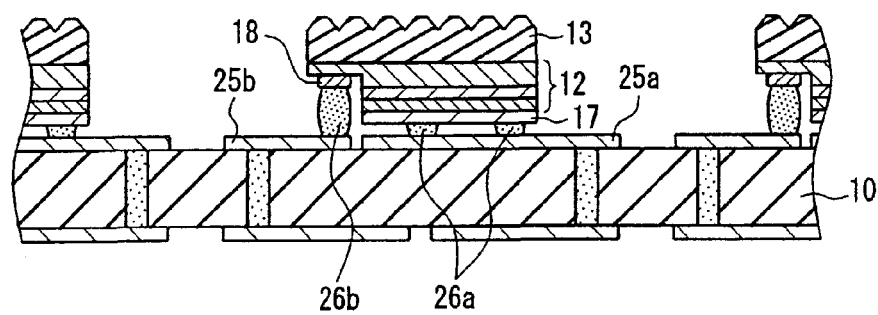

Following this, as shown in FIG. 5B, the first electrode 17 and the conductive pattern 25a are connected electrically via the bump 26a, and the second electrode 18 and the conductive pattern 25b are connected electrically via the bump 26b.

Figure 5C:
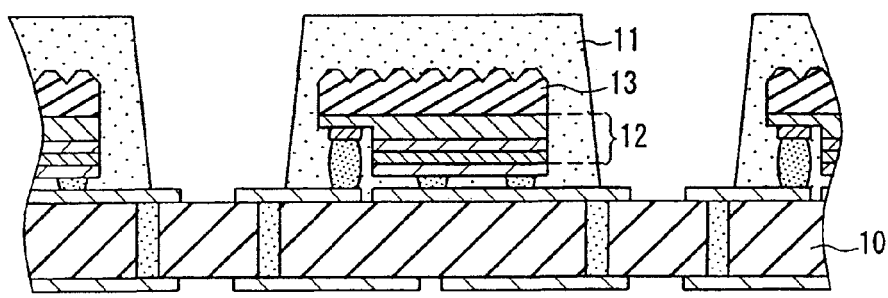

Next, as shown in FIG. 5C, a phosphor layer 11 is formed on the electrical insulating substrate 10 so as to cover the semiconductor multilayer film 12 and the single crystal substrate 13. For instance, the phosphor layer 11 may be formed by screen-printing a paste including a resin composition containing a phosphor and a silicone resin at a position covering the semiconductor multilayer film 12 and the single crystal substrate 13 on the electrical insulating substrate 10 using a screen having pores corresponding to the shape of the substantially truncated cone shape. Herein, in the state of FIG. 5C, the respective semiconductor light-emitting devices 1 (see FIG. 5D) provided on the electrical insulating substrate 10 may undergo inspections of electrical or optical properties, whereby non-defective semiconductor light-emitting devices 1 only can be selected. Further, the phosphor layer 11 may be ground by mechanical grinding or the like so as to perform color matching of the extracted light.

Figure 5D:
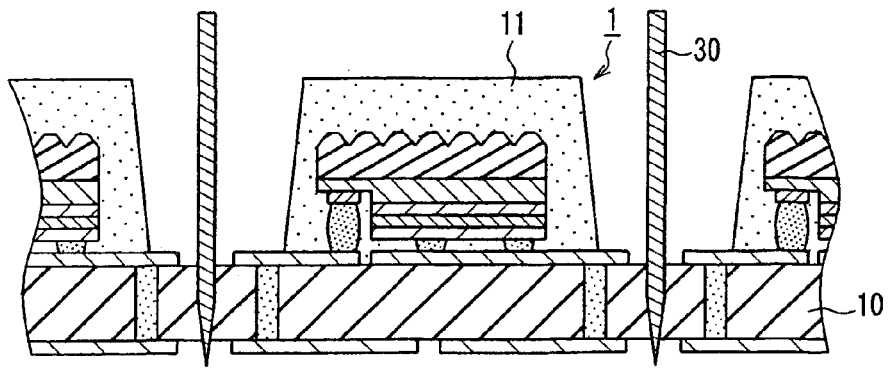

Then, the electrical insulating substrate 10 is cut into a substantially regular hexagonal prism shape that surrounds the region 10d of the electrical insulating substrate 10 on which the phosphor layer 11 is formed using the dicing blade 30 shown in FIG. 5D along the broken lines of FIG. 7. As a result, the outer edge 10c (see FIG. 7) of the principal surface 10a of the electrical insulating substrate 10 is formed into a substantially regular hexagonal shape, so that the semiconductor light-emitting device 1 (FIG. 5D) can be obtained.

Embodiment 2

Figure 8A:
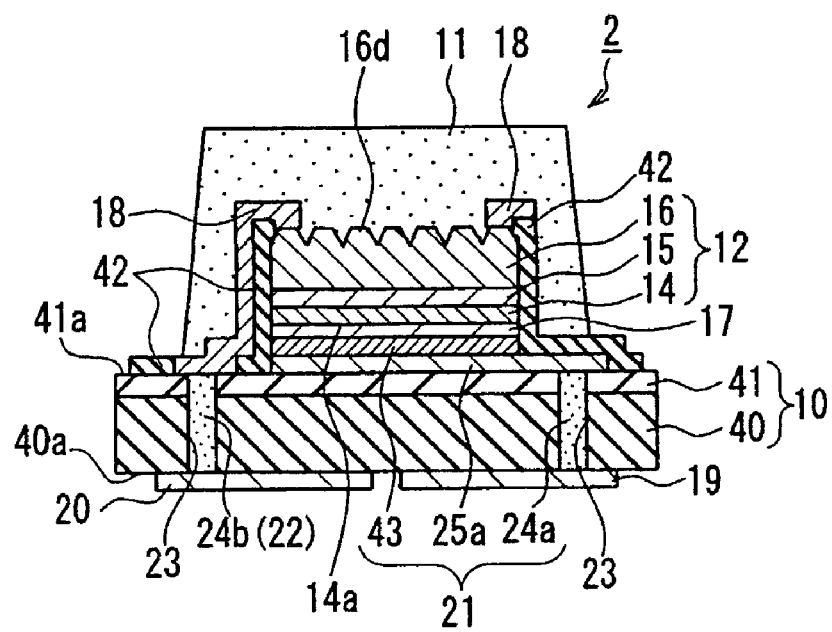
FIG. 8A is a cross-sectional view of a semiconductor light-emitting device according to Embodiment 2 of the present invention.
Figure 8B:
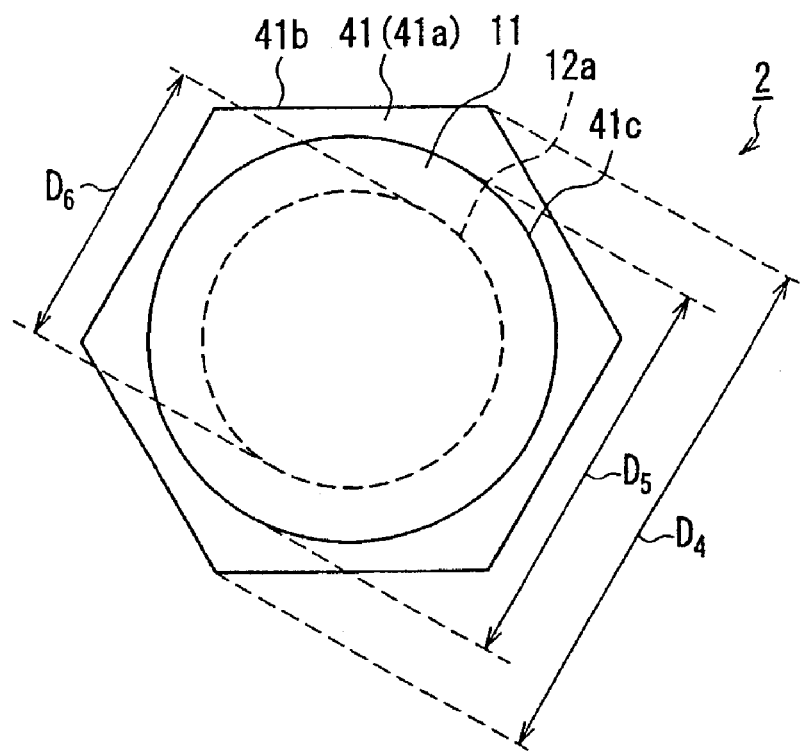
FIG. 8B is a schematic plan view of the semiconductor light-emitting device according to Embodiment 2 of the present invention when viewing from its phosphor layer side.

The following describes a semiconductor light-emitting device according to Embodiment 2 of the present invention, with reference to the drawings. FIG. 8 to be referred to herein is for explaining a semiconductor light-emitting device according to Embodiment 2, where FIG. 8A is a cross-sectional view of the semiconductor light-emitting device according to Embodiment 2, and FIG. 8B is a schematic plan view of the semiconductor light-emitting device according to Embodiment 2 when viewing from its phosphor layer side. Note here that the same reference numerals are assigned to the same elements as those in FIGS. 1A to C and their explanations are omitted.

The semiconductor light-emitting device 2 according to Embodiment 2, as shown in FIGS. 8A and B, includes: an electrical insulating substrate 10 formed in a substantially regular hexagonal prism shape; a phosphor layer 11 provided on the electrical insulating substrate 10 and formed in a substantially truncated cone shape; and a semiconductor multilayer film 12 provided on the electrical insulating substrate 10. The semiconductor multilayer film 12 is covered with the phosphor layer 11. As the electrical insulating substrate 10, the lamination of a high purity Si substrate 40 and a silicon oxide insulating film 41 are used for enhancing the electrical insulating properties.

The semiconductor multilayer film 12, as shown in FIG. 8A, is composed of a first conductivity type layer 14 made of a p-type semiconductor, for example, a light-emitting layer 15 and a second conductivity type layer 16 made of a n-type semiconductor, for example, which are laminated in this stated order from the side of the electrical insulating substrate 10 to have a diode structure. The second conductivity type layer 16 is disposed on the light-extraction side of the light emitted from the light-emitting layer 15. A principal surface 16d of the second conductivity type layer 16 as a surface contacting with the phosphor layer 11 is processed to have convexo-concave irregularities. This concave and convex improves the light extraction efficiency of the semiconductor light-emitting device 2. As shown in FIG. 8B, the outermost edge 12a of the semiconductor multilayer film 12 is formed in a substantially circular shape.

Besides the above-stated configuration, the semiconductor light-emitting device 2 includes, as shown in FIG. 8A: a first electrode 17 formed on a principal surface 14a of the first conductivity type layer 14; a second electrode 18 formed contacting with a part of the principal surface 16d of the second conductivity type layer 16; a first terminal 19 and a second terminal 20 formed on a principal surface 40a of the high purity Si substrate 40; a first conductive member 21 that electrically connects the first electrode 17 with the first terminal 19; a second conductive member 22 that electrically connects the second electrode 18 with the second terminal 20; and a silicon nitride insulating film 42 that keeps insulation between the first electrode 17 and the second electrode 18.

The first conductive member 21 includes: a via conductor 24a that contacts with the first terminal 19 and is formed in a via hole 23 provided in the electrical insulating substrate 10; a conductive pattern 25a that contacts with the via conductor 24a and is formed on the principal surface 41a of the silicon oxide insulating film 41; and a metal layer 43 that electrically connects the conductive pattern 25a with the first electrode 17. The second conductive member 22 includes a via conductor 24b that contacts with both of the second electrode 18 and the second terminal 20 and is formed in a via hole 23 provided in the electrical insulating substrate 10.

Since the phosphor layer 11 is formed in a substantially truncated cone shape as previously described, the outer edge of a cross-section of the phosphor layer 11 taken in a direction parallel to the principal surface of the electrical insulating substrate 10 on the side of the semiconductor multilayer film 12, i.e., the principal surface 41a of the silicon oxide insulating film 41, has a substantially circular shape. With this configuration, the semiconductor light-emitting device 2 can reduce anisotropy of the light emitted from the phosphor layer 11 and suppress non-uniformity in color of the extracted light, so that spot light symmetric with respect to a point can be obtained therefrom. Therefore, such a semiconductor light-emitting device can serve as a light source suitable for lighting devices. Further, since the electrical insulating substrate 10 is formed in a substantially regular hexagonal prism shape as previously described, the outer edge 41b of the principal surface 41a of the silicon oxide insulating film 41, formed in a substantially regular hexagonal shape, surrounds a region 41c in which the phosphor layer 11 is formed on the silicon oxide insulating film 41 as shown in FIG. 8B. With this configuration, the semiconductor light-emitting device 2 permits the high-density formation of the phosphor layer 11 on the silicon oxide insulating film 41, thus enabling a higher luminous flux and facilitating the processing of the outer shape of the electrical insulating substrate 10 during the manufacturing process of the semiconductor light-emitting device 2, which will be described later.

Further, in the semiconductor light-emitting device 2, the first electrode 17 is formed contacting with the principal surface 14a of the first conductivity type layer 14 and the phosphor layer 11 is formed contacting with the principal surface 16d of the second conductivity type layer 16, as shown in FIG. 8A. That is, since there is no single crystal substrate on the principal surface of the semiconductor multilayer film 12 in the semiconductor light-emitting device 2 that is used for crystal-growth of the semiconductor multilayer film 12, a thin semiconductor light-emitting device 2 can be configured as a whole. Moreover, the light emitted from the light-emitting layer 15 can be released without passing through the single crystal substrate, and therefore the light extraction efficiency can be enhanced.

Herein, regarding the outer edge 41b (see FIG. 8B) of the principal surface 41a of the silicon oxide insulating film 41, the length $D_4$ of the diagonal line (see FIG. 8B) may be 0.5 to 5 mm, for example. The radius $D_5$ (see FIG. 8B) of the region 41c in which the phosphor layer 11 is formed on the silicon oxide insulating film 41 may be 0.4 to 4.5 mm, for example. Regarding the outermost edge 12a of the semiconductor multilayer film 12, the radius $D_6$ (see FIG. 8B) may be 0.2 to 4 mm, for example.

The following describes a method for manufacturing the semiconductor light-emitting device 2 according to Embodiment 2 of the present invention, with reference to the drawings as required. FIG. 9 to FIG. 14 to be referred to herein are cross-sectional views showing the steps of the manufacturing method of the semiconductor light-emitting device 2 according to Embodiment 2. Note here that the same reference numerals are assigned to the same elements as those in FIGS. 8A and B and their explanations are omitted. The manufacturing method described below is one illustrative example according to the above-described second manufacturing method of the semiconductor light-emitting device of the present invention.

Figure 9A:
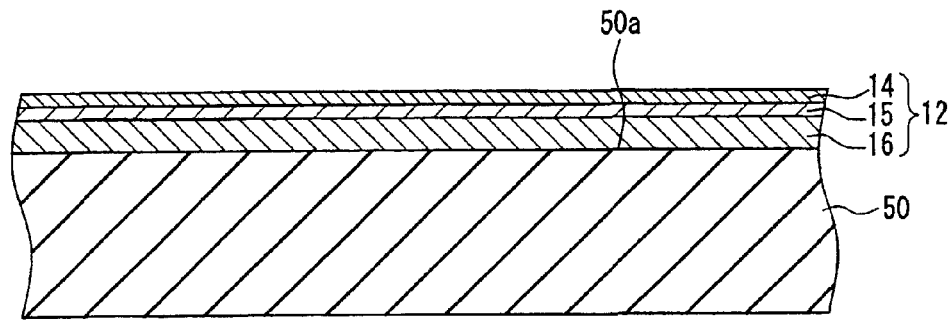
FIGS. 9A to C are cross-sectional views showing the steps of a manufacturing method of the semiconductor light-emitting device according to Embodiment 2 of the present invention.

Firstly, as shown in FIG. 9A, a second conductivity type layer 16, a light-emitting layer 15 and a first conductivity type layer 14 are laminated successively on a principal surface 50a of a single crystal substrate 50 by MOCVD technique or the like so as to form a semiconductor multilayer film 12. As the single crystal substrate 50, a sapphire substrate with a thickness of about 300 μm can be used, for example.

Figure 9B:
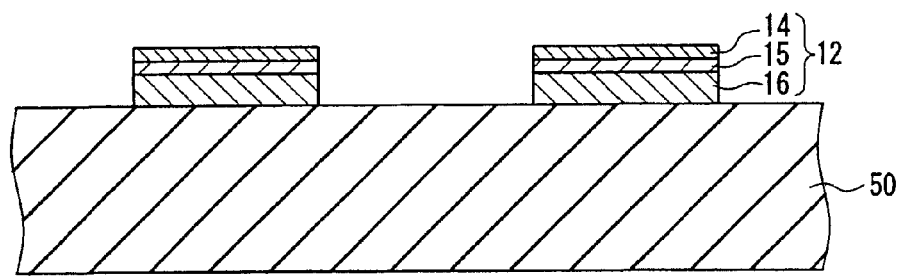

Following this, as shown in FIG. 9B, a part of the semiconductor multilayer film 12 is etched by dry etching or the like so that the semiconductor multilayer film 12 is left in a substantially cylindrical column shape.

Figure 9C:
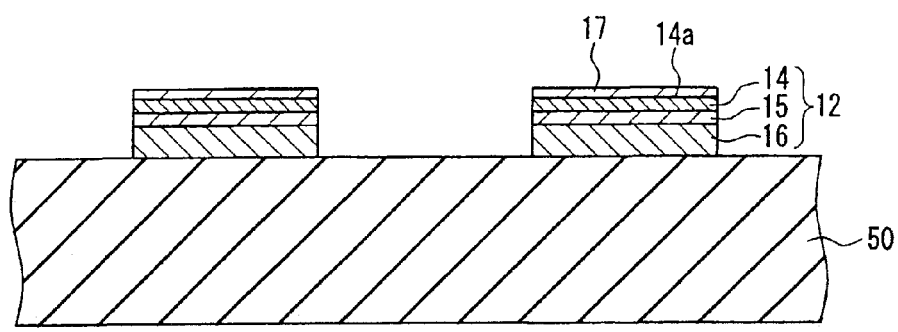

Following this, as shown in FIG. 9C, a first electrode 17 is formed by electron-beam evaporation or the like so as to contact with a principal surface 14a of the first conductivity type layer 14.

Figure 10A:
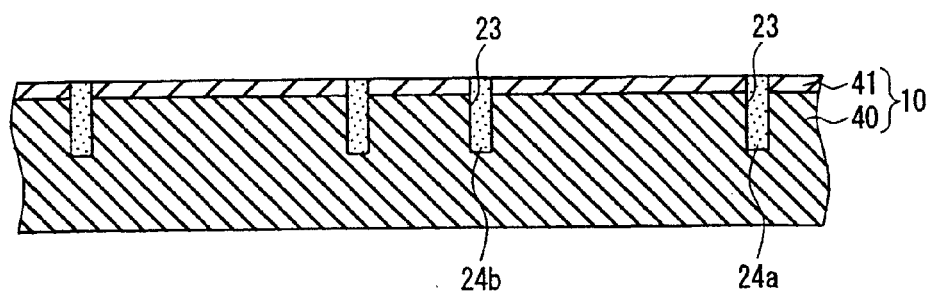
FIGS. 10A to C are cross-sectional views showing the steps of a manufacturing method of the semiconductor light-emitting device according to Embodiment 2 of the present invention.

Then, aside from this, an electrical insulating substrate 10 is prepared in which a high purity Si substrate 40 and a silicon oxide insulating film 41 are laminated, as shown in FIG. 10A. Via holes 23 are provided by dry etching or the like so as to penetrate through the silicon oxide insulating film 41 and a part of the high purity Si substrate 40. Then, via conductors 24a and 24b are formed in these via holes 23. The via conductors 24a and 24b may be formed by filling the via holes 23 with metal such as Pt by plating or the like. Note here that as the electrical insulating substrate 10, a lamination of the high purity Si substrate 40 with a thickness of about 300 μm and the silicon oxide insulating film 41 with a thickness of about 0.5 μm can be used for example.

Figure 10B:
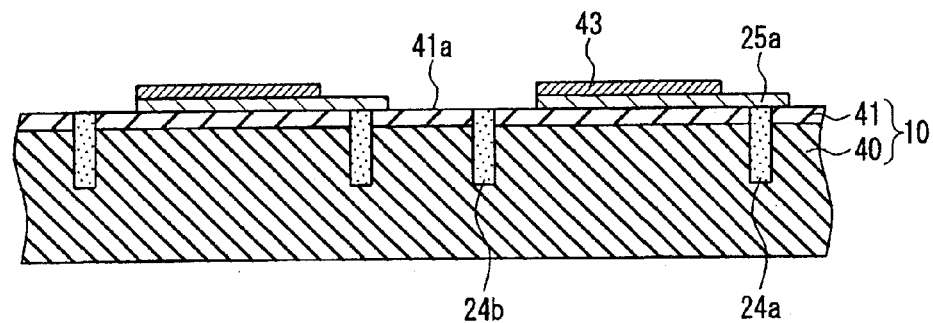

Following this, as shown in FIG. 10B, a conductive pattern 25a is formed on the principal surface 41a of the silicon oxide insulating film 41 so as to electrically connect with the via conductor 24a. For instance, the conductive pattern 25a can be formed by forming a metal film such as a Ti/Pt/Au film on the principal surface 41a of the silicon oxide insulating film 41 by evaporation or the like, followed by patterning of this metal film into a predetermined shape by lift-off technique or the like. Next, a metal layer 43 such as an Au/Sn layer is formed on the conductive pattern 25a by plating or the like.

Figure 10C:
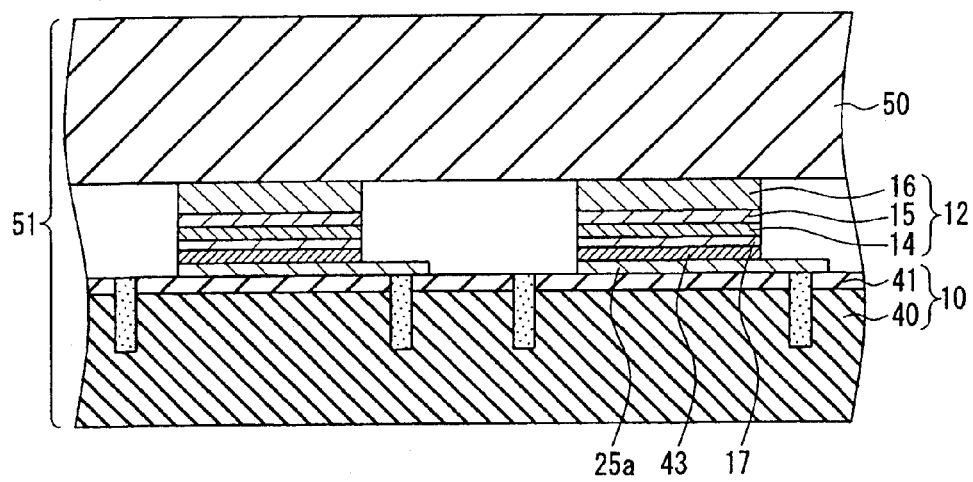

Following this, as shown in FIG. 10C, the first electrode 17 and the metal layer 43 are heated at a temperature for allowing the metal layer 43 to melt (e.g., about 300° C.) and are bonded with each other, whereby a lamination member 51 is formed in which the semiconductor multilayer film 12 is sandwiched between the single crystal substrate 50 and the electrical insulating substrate 10.

Figure 11A:
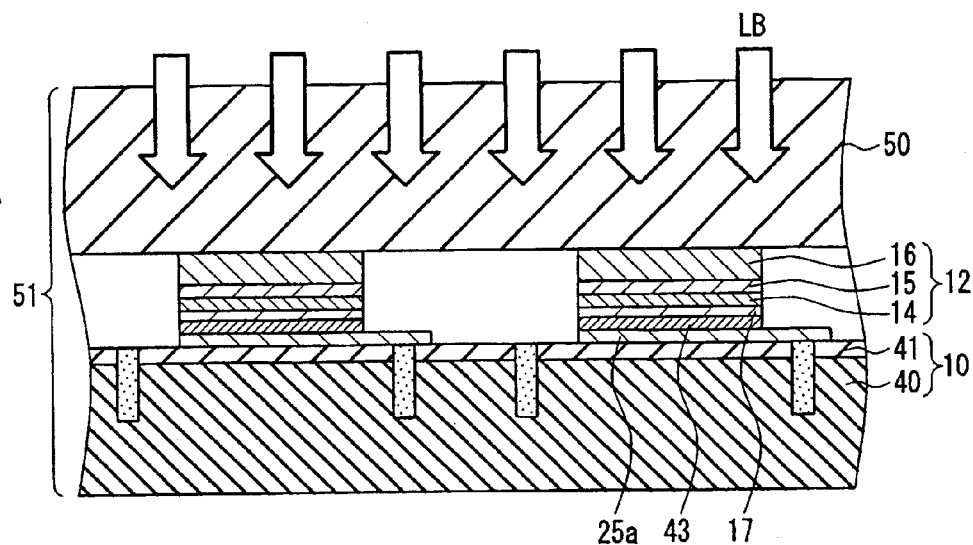
FIGS. 11A to C are cross-sectional views showing the steps of a manufacturing method of the semiconductor light-emitting device according to Embodiment 2 of the present invention.
Figure 11B:
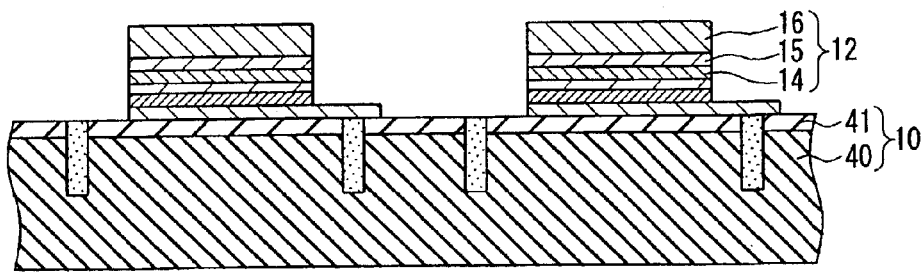

Then, the single crystal substrate 50 is detached from the semiconductor multilayer film 12. For instance, as shown in FIG. 11A, the bonding force at an interface between the single crystal substrate 50 and the semiconductor multilayer film 12 may be decreased by irradiation with a laser beam LB from the side of the single crystal substrate 50, and then as shown in FIG. 11B, the single crystal substrate 50 may be detached from the semiconductor multilayer film 12 (i.e., the second conductivity type layer 16). Herein, after detaching the single crystal substrate 50, preferably, the metal (e.g., Ga) remaining on the second conductivity type layer 16 is removed by hydrochloric acid or the like.

Figure 11C:
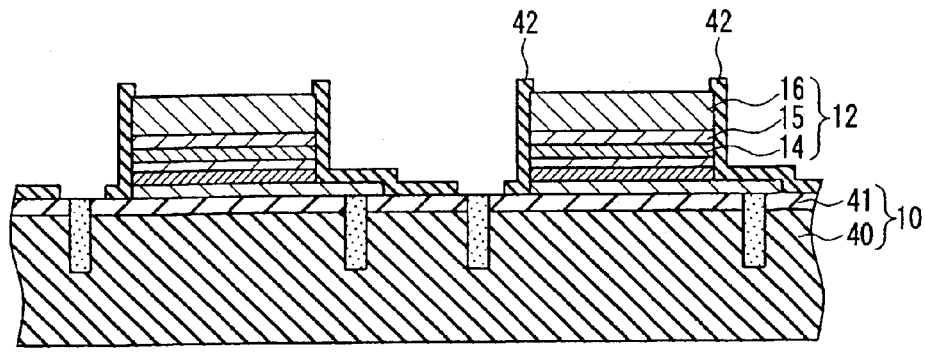

Following this, as shown in FIG. 11C, a silicon nitride insulating film 42 is formed at predetermined positions on the silicon oxide insulating film 41 and around the semiconductor multilayer film 12. For instance, a silicon nitride insulating film 42 with a thickness of about 0.3 to 1 μm may be formed on the entire surface of the silicon oxide insulating film 41 so as to cover the semiconductor multilayer film 12 by high-frequency sputtering or the like, and then the silicon nitride insulting film 42 may be etched by dry etching or the. like so that the silicon nitride film 42 remains only at the portions where insulation should be kept.

Figure 12A:
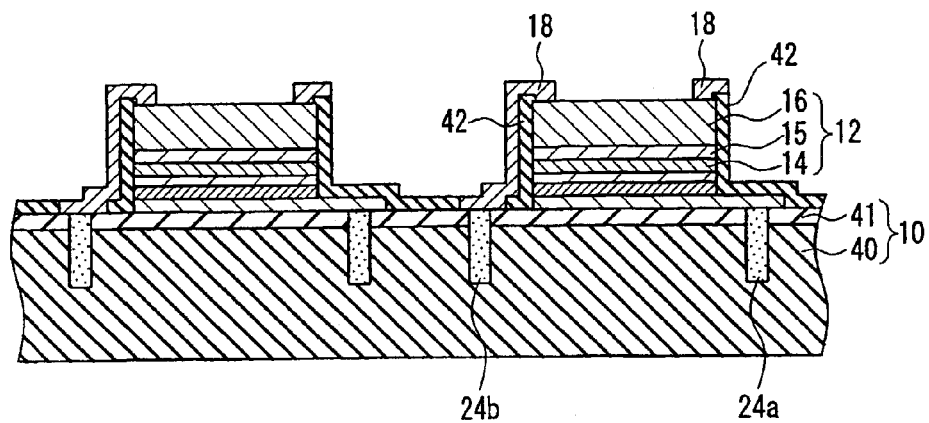
FIGS. 12A to C are cross-sectional views showing the steps of a manufacturing method of the semiconductor light-emitting device according to Embodiment 2 of the present invention.

Next, as shown in FIG. 12A, a second electrode 18 is formed so as to electrically connect the second conductivity type layer 16 with the via conductor 24b. For instance, the second electrode 18 may be formed by forming a metal film such as a Ti/Pt/Al film by evaporation or the like at a connecting portion of the second conductivity type layer 16 and the via conductor 24b.

Figure 12B:
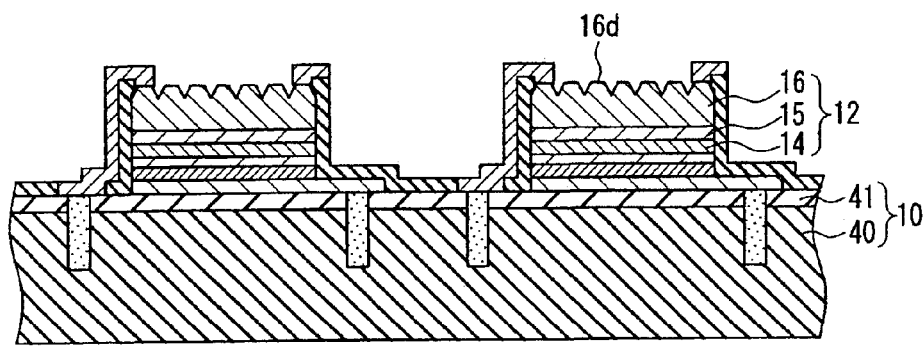

Following this, as shown in FIG. 12B, a principal surface 16d of the second conductivity type layer 16 is processed to have convexo-concave irregularities by means of dry etching or the like. Thereby, the light extraction efficiency of the formed semiconductor light-emitting device 2 can be enhanced.

Figure 12C:
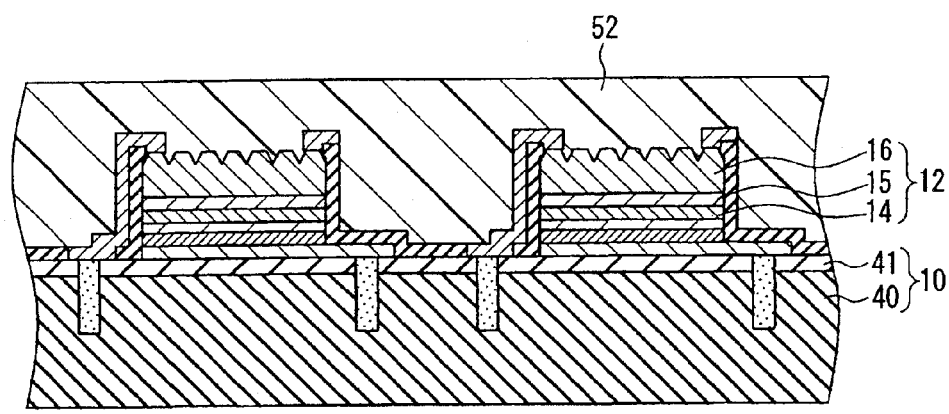

Following this, as shown in FIG. 12C, a peelable polymer film 52 is bonded to the entire surface of the electrical insulating substrate 10 so as to cover the semiconductor multilayer film 12. For instance, the polymer film 52 may be bonded to the electrical insulating substrate 10 via an adhesion layer (not illustrated) that is made of polyester or the like and has a property of generating foam by the application of heat and losing the adhesion. This polymer film 52 is used as a supporting member for facilitating the handling during the manufacturing process. Herein, as the polymer film 52, a polyester based film or a polyimide based film whose thickness is about 0.5 to 1 mm can be used, for example.

Figure 13A:
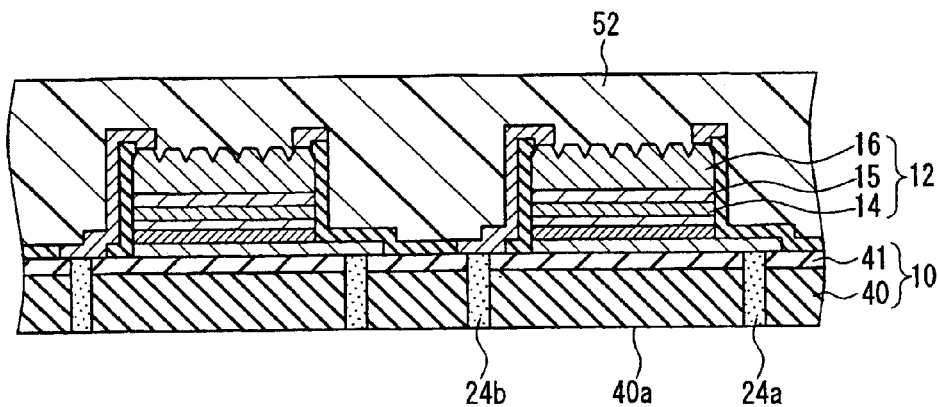
FIGS. 13A to C are cross-sectional views showing the steps of a manufacturing method of the semiconductor light-emitting device according to Embodiment 2 of the present invention.

Next, as shown in FIG. 13A, the principal surface 40a of the high purity Si substrate 40 is ground by mechanical grinding or the like so that the via conductors 24a and 24b are exposed. For instance, the grinding may be performed so that the electrical insulating substrate 10 has a thickness of about 200 μm.

Figure 13B:
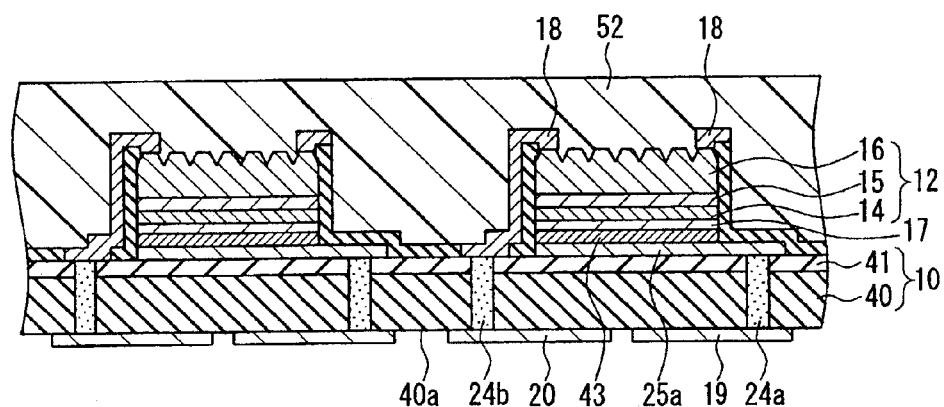

Following this, as shown in FIG. 13B, on the principal surface 40a of the high purity Si substrate 40, a first terminal 19 is formed so as to electrically connect with the conductive pattern 25a through the via conductor 24a and a second terminal 20 is formed so as to electrically connect with the second electrode 18 through the via conductor 24b. For instance, the first and the second terminals 19 and 20 can be formed by forming a primary film including a Ti/Au thin film by electron-beam evaporation or the like at portions where the via conductors 24a and 24b are exposed on the principal surface 40a of the high purity Si substrate 40, followed by the lamination of an Au layer on this primary film by plating or the like.

Figure 13C:
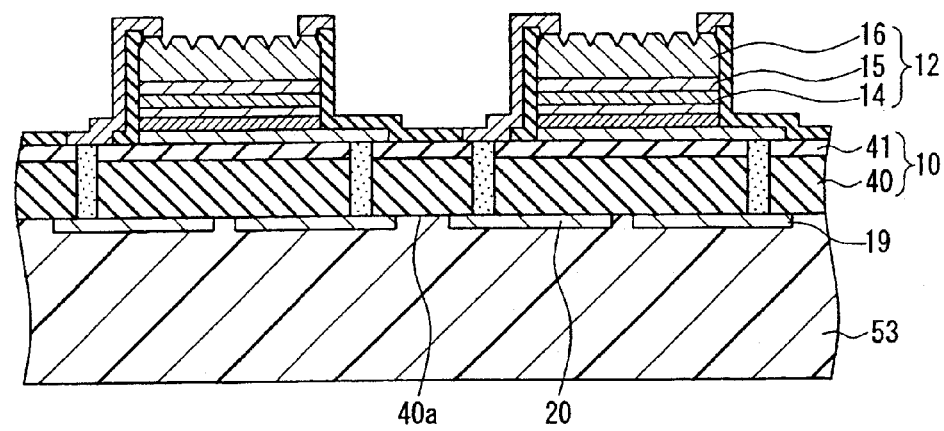

Following this, the polymer film 52 is peeled off, and as shown in FIG. 13C, a peelable polymer film 53 is bonded to the entire surface of the principal surface 40a of the high purity Si substrate 40 so as to cover the first and the second terminals 19 and 20. The material and the bonding method of the polymer film 53 are the same as those in the case of the polymer film 52 described above.

Figure 14A:
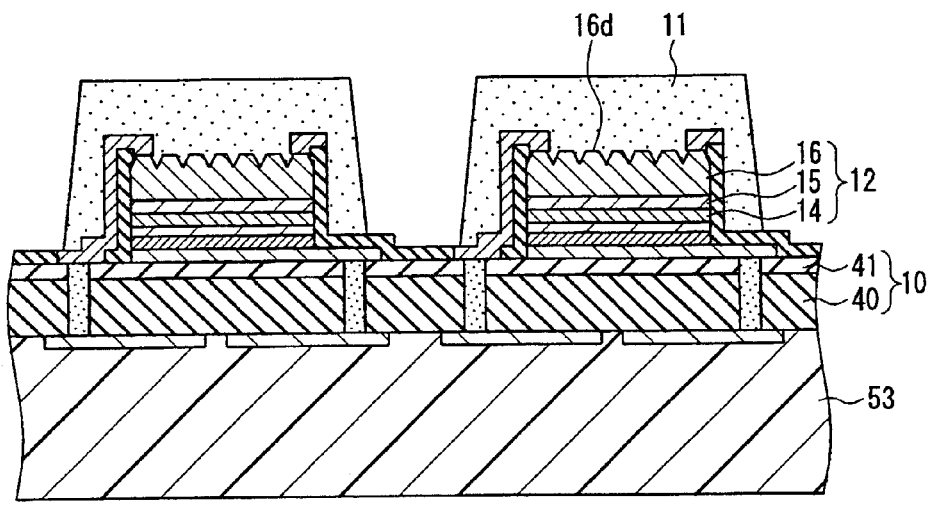
FIGS. 14A and B are cross-sectional views showing the steps of a manufacturing method of the semiconductor light-emitting device according to Embodiment 2 of the present invention.

Next, as shown in FIG. 14A, a phosphor layer 11 is formed on the electrical insulating substrate 10 so as to contact with the principal surface 16d of the second conductivity type layer 16 and cover the semiconductor multilayer film 12. The formation method of the phosphor layer 11 is the same as that in the case of the semiconductor light-emitting device 1 described above (see FIG. 5C). Herein, in the state of FIG. 14A, the respective semiconductor light-emitting devices 2 (see FIG. 14B) provided on the electrical insulating substrate 10 may undergo inspections of electrical or optical properties, whereby non-defective semiconductor light-emitting devices 2 only can be selected. Further, the phosphor layer 11 may be ground by mechanical grinding or the like so as to perform color matching of the extracted light.

Figure 14B:
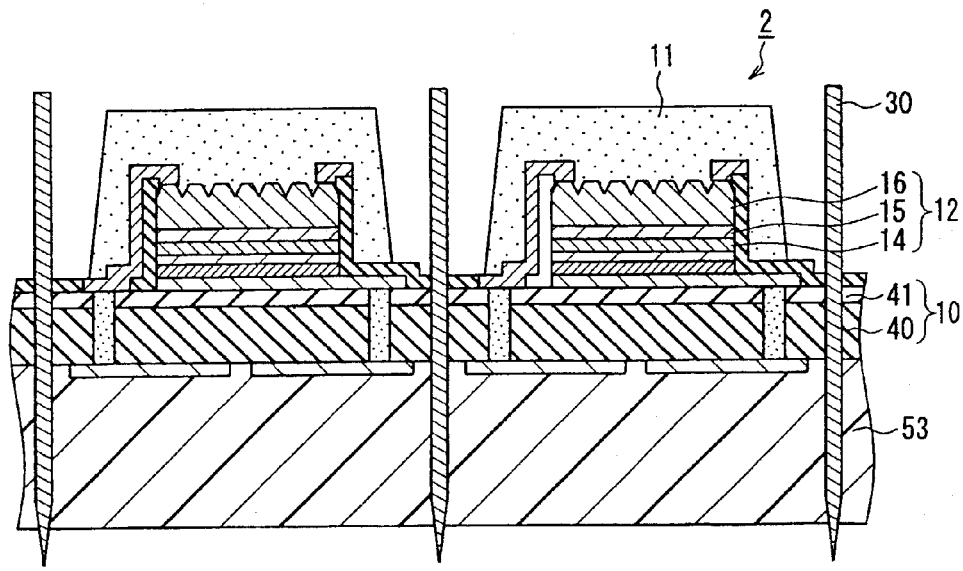

Then, similarly to the manufacturing method of the semiconductor light-emitting device 1 described above (see FIG. 5D), the electrical insulating substrate 10 and the polymer film 53 are cut into a substantially regular hexagonal prism shape using a dicing blade 30 shown in FIG. 14B. As a result, the outer edge 41b (see FIG. 8B) of the principal surface 41a of the silicon oxide insulating film 41 is formed into a substantially regular hexagonal shape. Then, the polymer film 53 is peeled off (not illustrated), so that the semiconductor light-emitting device 2 can be obtained.

Embodiment 3

Figure 15A:
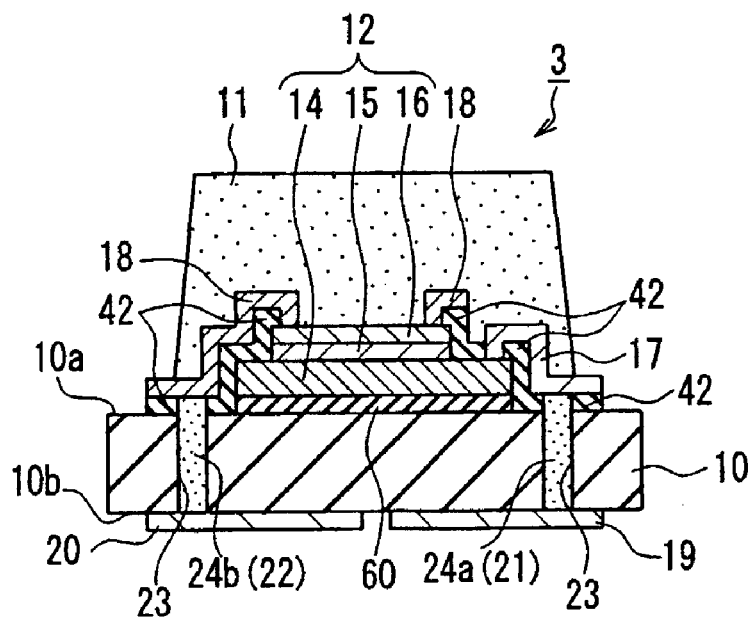
FIG. 15A is a cross-sectional view of a semiconductor light-emitting device according to Embodiment 3 of the present invention.
Figure 15B:
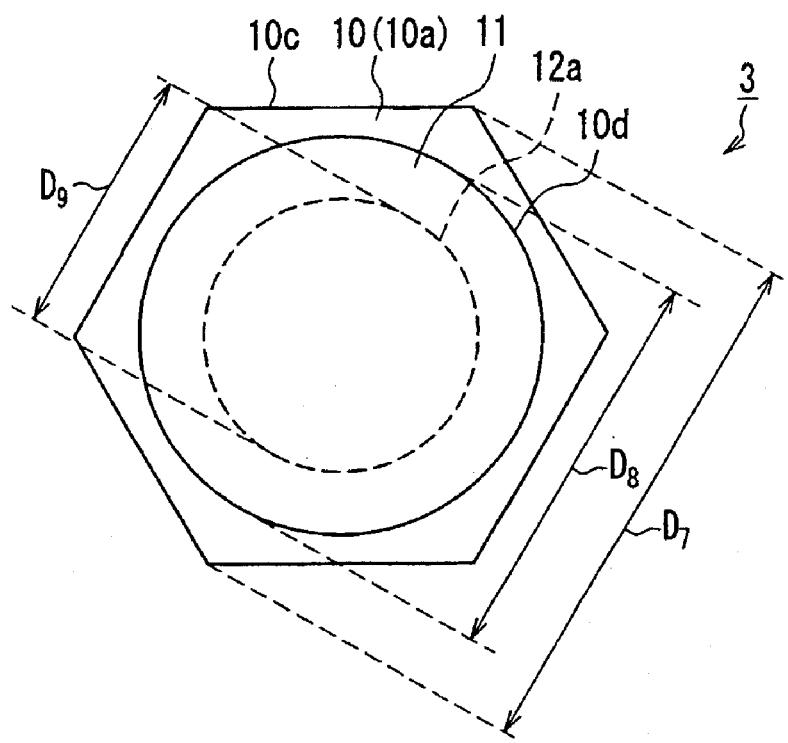
FIG. 15B is a schematic plan view of the semiconductor light-emitting device according to Embodiment 3 of the present invention when viewing from its phosphor layer side.

The following describes a semiconductor light-emitting device according to Embodiment 3 of the present invention, with reference to the drawings. FIG. 15 to be referred to herein is for explaining a semiconductor light-emitting device according to Embodiment 3, where FIG. 15A is a cross-sectional view of the semiconductor light-emitting device according to Embodiment 3, and FIG. 15B is a schematic plan view of the semiconductor light-emitting device according to Embodiment 3 when viewing from its phosphor layer side. Note here that the same reference numerals are assigned to the same elements as those in FIGS. 1A to C and FIGS. 8A and B and their explanations are omitted.

The semiconductor light-emitting device 3 according to Embodiment 3, as shown in FIGS. 15A and B, includes: an electrical insulating substrate 10 formed in a substantially regular hexagonal prism shape; a phosphor layer 11 provided on the electrical insulating substrate 10 and formed in a substantially truncated cone shape; and a semiconductor multilayer film 12 provided on the electrical insulating substrate 10. The semiconductor multilayer film 12 is covered with the phosphor layer 11.

The semiconductor multilayer film 12, as shown in FIG. 15A, is composed of a first conductivity type layer 14 made of a n-type semiconductor, for example, a light-emitting layer 15 and a second conductivity type layer 16 made of a p-type semiconductor, for example, which are laminated in this stated order from the side of the electrical insulating substrate 10 to have a diode structure. The second conductivity type layer 16 is disposed on the light-extraction side of the light emitted from the light-emitting layer 15. As shown in FIG. 15B, the outermost edge 12a of the semiconductor multilayer film 12 is formed in a substantially regular circular shape.

Besides the above-stated configuration, the semiconductor light-emitting device 3 includes, as shown in FIG. 15A: a first electrode 17 contacting with the first conductivity type layer 14; a second electrode 18 contacting with the second conductivity type layer 16; a first terminal 19 and a second terminal 20 formed on a rear face 10b of the electrical insulating substrate 10 with respect to a principal surface 10a on the side of the semiconductor multilayer film 12; a first conductive member 21 that electrically connects the first electrode 17 with the first terminal 19; a second conductive member 22 that electrically connects the second electrode 18 with the second terminal 20; and a silicon nitride insulating film 42 that keeps insulation between the first electrode 17 and the second electrode 18.

The first conductive member 21 includes a via conductor 24a that contacts with both of the first electrode 17 and the first terminal 19 and is formed in a via hole 23 provided in the electrical insulating substrate 10. The second conductive member 22 includes a via conductor 24b that contacts with both of the second electrode 18 and the second terminal 20 and is formed in a via hole 23 provided in the electrical insulating substrate 10.

Since the phosphor layer 11 is formed in a substantially truncated cone shape as previously described, the outer edge of a cross section of the phosphor layer 11 taken in a direction parallel to the principal surface 10a of the electrical insulating substrate 10 has a substantially circular shape. With this configuration, the semiconductor light-emitting device 3 can reduce anisotropy of the light emitted from the phosphor layer 11 and suppress non-uniformity in color of the extracted light, and spot light symmetric with respect to a point can be obtained therefrom. Therefore, such a semiconductor light-emitting device can serve as a light source suitable for lighting devices. Further, since the electrical insulating substrate 10 is formed in a substantially regular hexagonal prism shape as previously described, the outer edge 10c of the principal surface 10a of the electrical insulating substrate 10, formed in a substantially regular hexagonal shape, surrounds a region 10d in which the phosphor layer 11 is formed on the electrical insulating substrate 10 as shown in FIG. 15B. With this configuration, the semiconductor light-emitting device 3 permits the high-density formation of the phosphor layer 11 on the electrical insulating substrate 10, thus enabling a higher luminous flux and facilitating the processing of the outer shape of the electrical insulating substrate 10 during the manufacturing process of the semiconductor light-emitting device 3, which will be described later.

The semiconductor light-emitting device 3 further includes a mirror layer 60 interposed between the first conductivity type layer 14 and the electrical insulating substrate 10 as shown in FIG. 15A. As the mirror layer 60, a lamination, whose thickness is about 1 to 3 μm, in which a plurality of AlGaN layers and GaN layers are laminated alternately can be used for example. Thereby, the semiconductor light-emitting device 3 allows, out of the light traveling from the light-emitting layer 15 to the side of the electrical insulating substrate 10, only the light required for the illumination light to be reflected selectively by the mirror layer 60 to the light extraction side.

Herein, regarding the outer edge 10c of the principal surface 10a of the electrical insulating substrate 10 (see FIG. 15B), the length $D_7$ of the diagonal line (see FIG. 15B) may be 0.5 to 5 mm, for example. The radius $D_8$ of the region 10d in which the phosphor layer 11 is formed on the electrical insulating substrate 10 (see FIG. 15B) may be 0.4 to 4.5 mm, for example. Regarding the outermost edge 12a of the semiconductor multilayer film 12, the radius $D_9$ (see FIG. 15B) may be 0.2 to 4 mm, for example.

The following describes a method for manufacturing the semiconductor light-emitting device 3 according to Embodiment 3 of the present invention, with reference to the drawings as required. FIG. 16 to FIG. 18 to be referred to herein are cross-sectional views showing the steps of the manufacturing method of the semiconductor light-emitting device 3 according to Embodiment 3. Note here that the same reference numerals are assigned to the same elements as those in FIGS. 15A and B and their explanations are omitted.

Figure 16A:
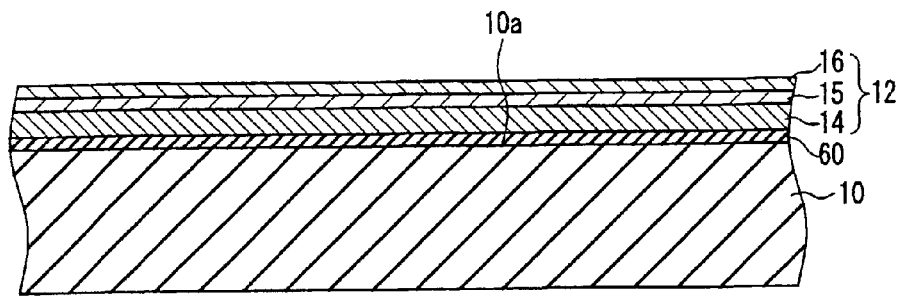
FIGS. 16A to D are cross-sectional views showing the steps of a manufacturing method of the semiconductor light-emitting device according to Embodiment 3 of the present invention.

Firstly, as shown in FIG. 16A, a mirror layer 60 is laminated by MOCVD technique or the like on a principal surface 10a of an electrical insulating substrate 10, and then a first conductivity type layer 14, a light-emitting layer 15 and a second conductivity type layer 16 are laminated successively on the mirror layer 60 by MOCVD technique or the like so as to form a semiconductor multilayer film 12. As the electrical insulating substrate 10, a high purity SiC substrate with a thickness of about 300 μm can be used, for example.

Figure 16B:
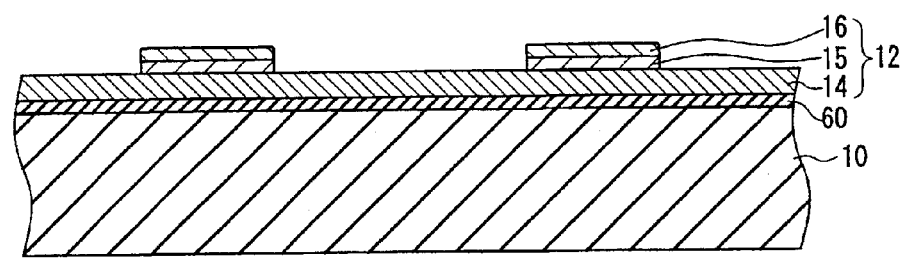
Figure 16C:
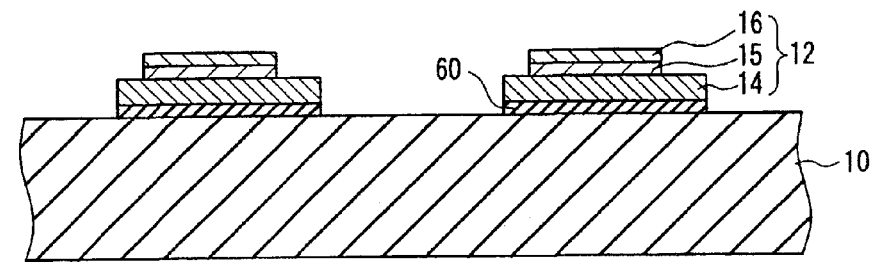

Following this, as shown in FIG. 16B, a part of the second conductivity type layer 16 and a part of the light-emitting layer 15 are etched by dry etching or the like. Next, as shown in FIG. 16C, a part of the first conductivity type layer 14 and a part of the mirror layer 60 are etched by dry etching or the like. At this time, the etching is performed so that a step is formed between the first conductivity type layer 14 and the light-emitting layer 15 and the outermost edge 12a of the semiconductor multilayer film 12 is left in a substantially circular shape (see FIG. 15B).

Figure 16D:
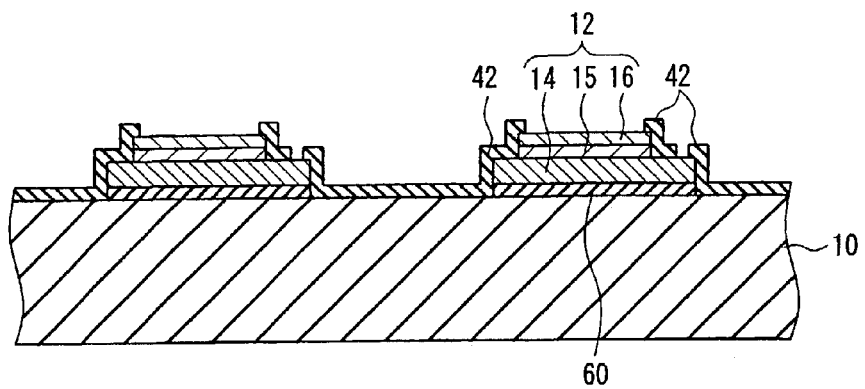

Following this, as shown in FIG. 16D, a silicon nitride insulating film 42 is formed at predetermined positions on the electrical insulating substrate 10 and around the semiconductor multilayer film 12. The formation method of the silicon nitride insulating film 42 is the same as that in the case of the manufacturing method of the semiconductor light-emitting device 2 described above (see FIG. 11C).

Figure 17A:
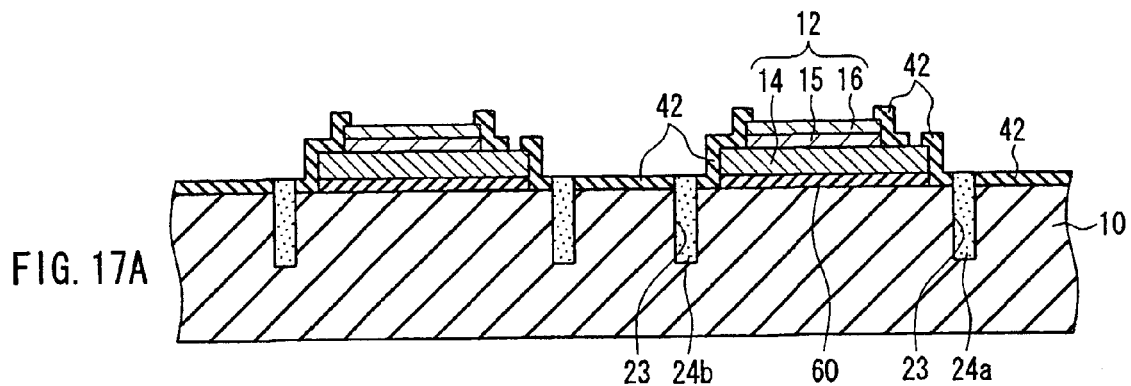
FIGS. 17A to D are cross-sectional views showing the steps of a manufacturing method of the semiconductor light-emitting device according to Embodiment 3 of the present invention.

Next, as shown in FIG. 17A, via holes 23 are provided by dry etching or the like so as to penetrate through the silicon nitride insulating film 42 and a part of the electrical insulating substrate 10, and then via conductors 24a and 24b are formed in these via holes 23. The via conductors 24a and 24b may be formed by filling the via holes 23 with metal such as Pt by plating or the like.

Figure 17B:
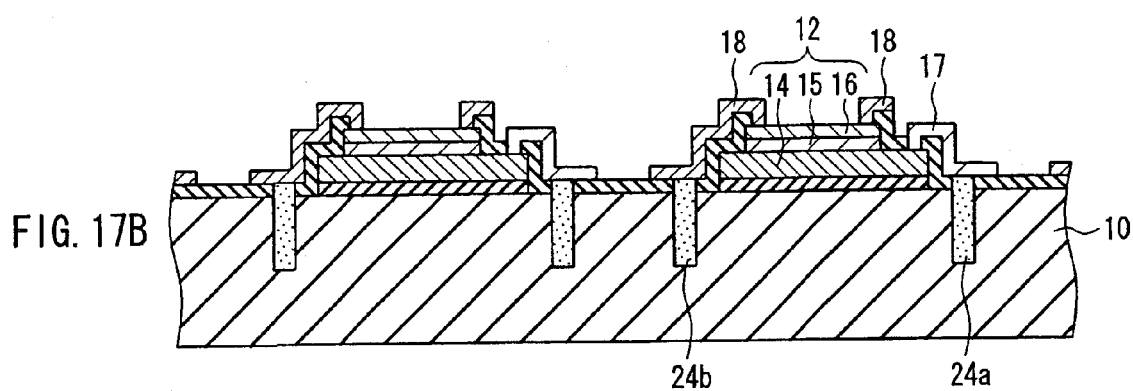

Following this, as shown in FIG. 17B, a first electrode 17 is formed so as to electrically contact the first conductivity type layer 14 with the via conductor 24a and a second electrode 18 is formed so as to electrically contact the second conductivity type layer 16 with the via conductor 24b. The first electrode 17 and the second electrode 18 may be formed for example by forming a metal film such as a Ti/Pt/Al film by evaporation or the like at a connecting portion of the first conductivity type layer 14 and the via conductor 24a and at a connecting portion of the second conductivity type layer 16 and the via conductor 24b.

Figure 17C:
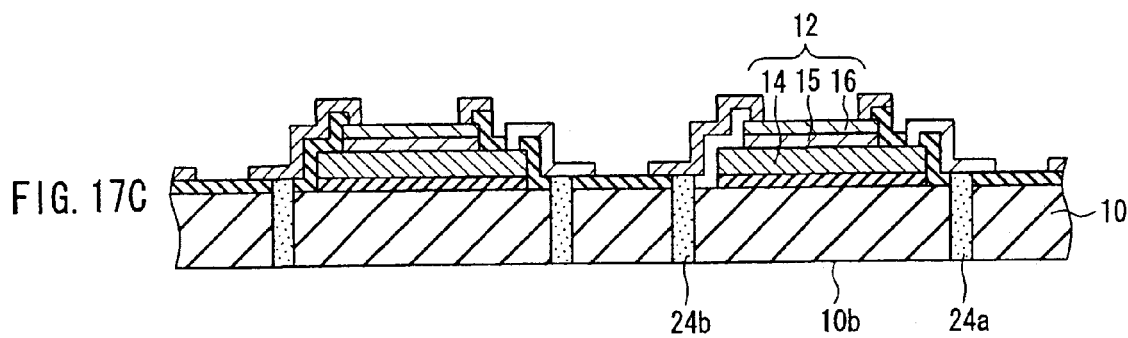

Following this, as shown in FIG. 17C, the rear face 10b of the electrical insulating substrate 10 is ground by mechanical grinding or the like so that the via conductors 24a and 24b are exposed. For instance, the grinding may be performed so that the electrical insulating substrate 10 has a thickness of about 200 μm.

Figure 17D:
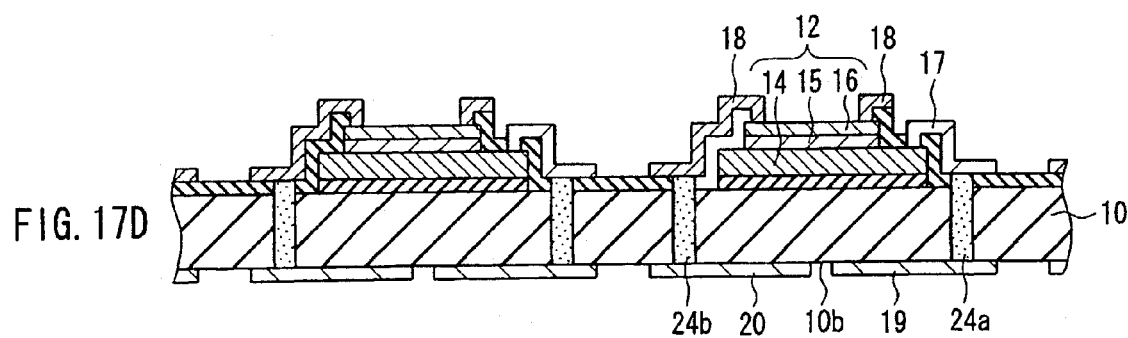

Following this, as shown in FIG. 17D, on the rear face 10b of the electrical insulating substrate 10, a first terminal 19 is formed so as to electrically connect with the first electrode 17 through the via conductor 24a and a second terminal 20 is formed so as to electrically connect with the second electrode 18 through the via conductor 24b. The formation method of the first and the second terminals 19 and 20 is the same as that in the case of the manufacturing method of the semiconductor light-emitting device 2 described above (see FIG. 13B).

Figure 18A:
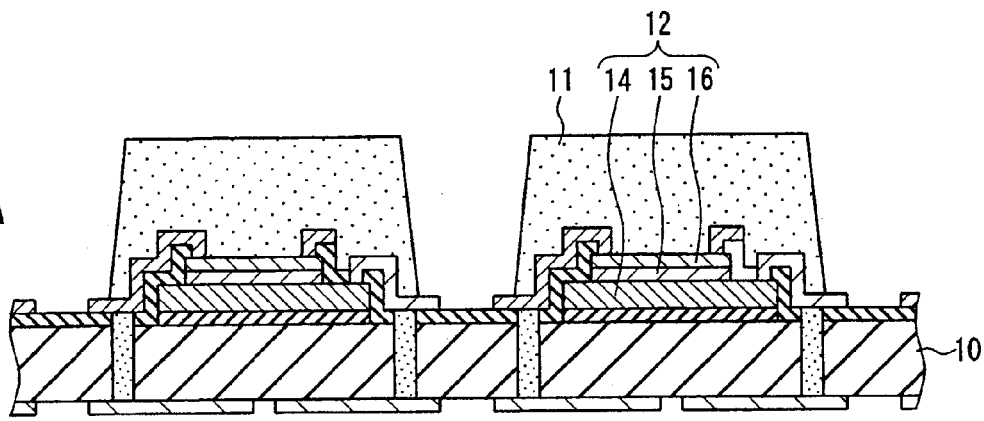
FIGS. 18A and B are cross-sectional views showing the steps of a manufacturing method of the semiconductor light-emitting device according to Embodiment 3 of the present invention.

Next, as shown in FIG. 18A, a phosphor layer 11 is formed on the electrical insulating substrate 10 so as to cover the semiconductor multilayer film 12. The formation method of the phosphor layer 11 is the same as that in the case of the semiconductor light-emitting device 1 described above (see FIG. 5C). Herein, in the state of FIG. 18A, the respective semiconductor light-emitting devices 3 (see FIG. 18B) provided on the electrical insulating substrate 10 may undergo inspections of electrical or optical properties, whereby non-defective semiconductor light-emitting devices 3 only can be selected. Further, the phosphor layer 11 may be ground by mechanical grinding or the like so as to perform color matching of the extracted light.

Figure 18B:
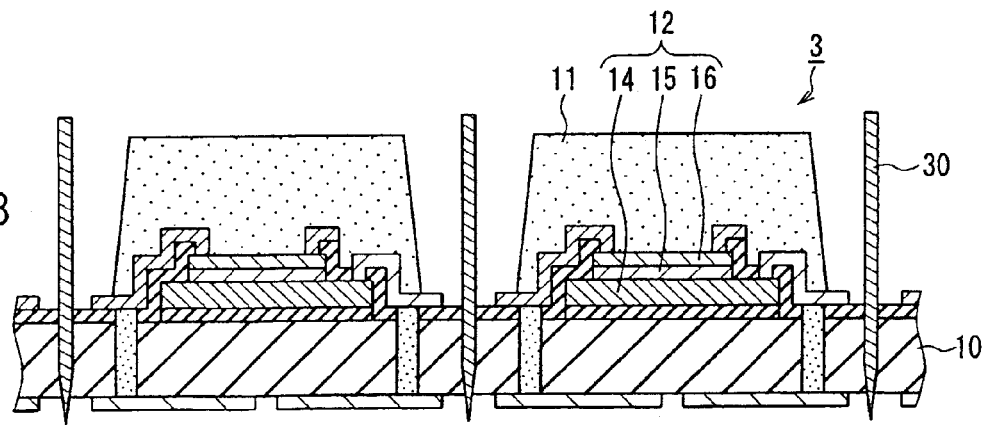

Then, similarly to the manufacturing method of the semiconductor light-emitting device 1 described above (see FIG. 5D), the electrical insulating substrate 10 is cut into a substantially regular hexagonal prism shape using a dicing blade 30 shown in FIG. 18B. As a result, the outer edge 10c (see FIG. 15B) of the principal surface 10a of the electrical insulating substrate 10 is formed into a substantially regular hexagonal shape, so that the semiconductor light-emitting device 3 (FIG. 18B) can be obtained.

Embodiment 4

Figure 19A:
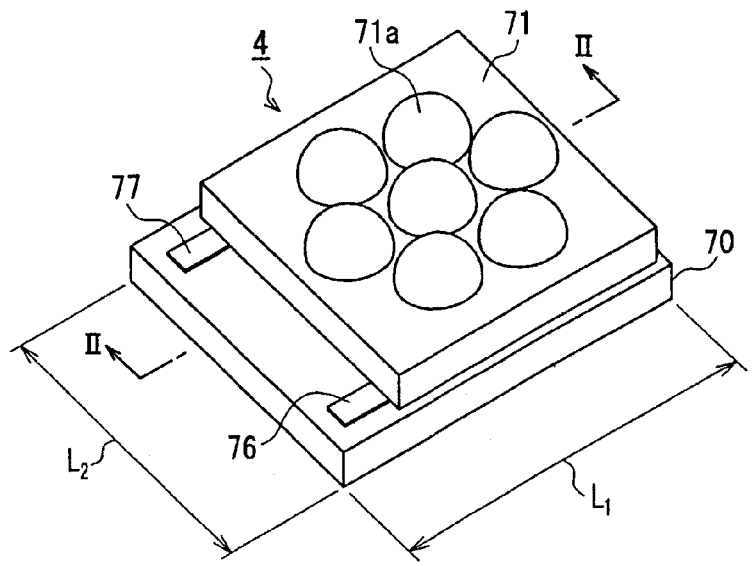
FIG. 19A is a perspective view of a lighting module according to Embodiment 4 of the present invention.
Figure 19B:
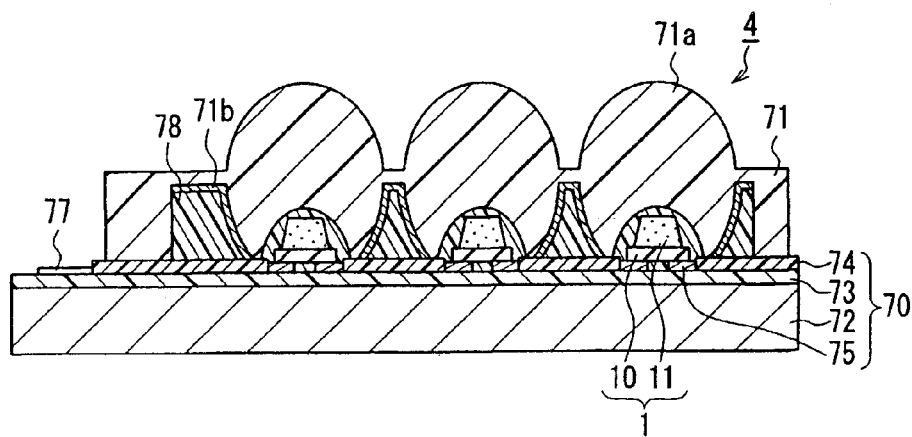
FIG. 19B is a cross-sectional view taken along the line II-II of FIG. 19A
Figure 19C:
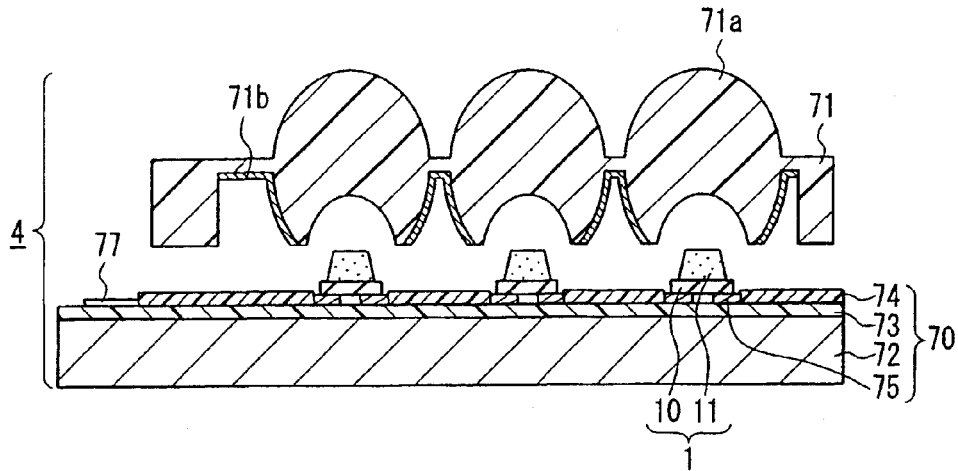
FIG. 19C is an exploded view of the lighting module according to Embodiment 4 of the present invention illustrated in FIG. 19B.

The following describes a lighting module according to Embodiment 4 of the present invention, with reference to the drawings as required. FIG. 19 to be referred to herein is for explaining a lighting module according to Embodiment 4, where FIG. 19A is a perspective view of the lighting-module according to Embodiment 4, FIG. 19B is a cross-sectional view taken along the line II-II of FIG. 19A and FIG. 19C is an exploded view of the lighting module according to Embodiment 4 illustrated in FIG. 19B. Note here that the lighting module according to Embodiment 4 includes the above-described semiconductor light-emitting device 1 according to Embodiment 1. The same reference numerals are assigned to the same elements as those in FIGS. 1A to C and their explanations are omitted.

The lighting module 4 according to Embodiment 4, as shown in FIGS. 19A and B, includes: a mounting board 70; seven semiconductor light-emitting devices 1 mounted on the mounting board 70; and a lens 71 bonded to the mounting board 70 so as to cover the semiconductor light-emitting devices 1.

The mounting board 70, as shown in FIG. 19B, includes: an aluminum substrate 72; a first electrical insulating layer 73 laminated on the aluminum substrate 72; a second electrical insulating layer 74 laminated on the first electrical insulating layer 73; and a wiring pattern 75 formed on the first electrical insulating layer 73. End portions of the wiring pattern 75 serve as a first feeding terminal 76 and a second feeding terminal 77 shown in FIG. 19A. The semiconductor light-emitting devices 1 are flip-chip mounted on the wiring pattern 75. In the present embodiment, as materials of the first and the second electrical insulating layers 73 and 74, a composite material is used containing a thermosetting resin such as an epoxy resin and an inorganic filler such as alumina.

The lens 71, as shown in FIG. 19C, includes convex portions 71a corresponding to the respective semiconductor light-emitting devices 1 and an aluminum film 71b that reflects light emitted from the semiconductor light-emitting devices 1. The lens 71 is bonded to the mounting board 70 with an adhesive 78 made of an epoxy resin or the like (see FIG. 19B).

The thus configured lighting module 4 includes the semiconductor light-emitting devices 1 according to one embodiment of the present invention, and therefore non-uniformity in color of the extracted light can be suppressed and a higher luminous flux can be obtained.

Regarding the mounting board 70 used in the present embodiment, the thicknesses of the aluminum substrate 72, the first electrical insulating layer 73 and the second electrical insulating layer 74 are 1 mm, 0.5 mm and 0.5 mm, respectively, and the length in the vertical direction ($L_1$) and the length in the horizontal direction ($L_2$) shown in FIG. 19A are 28 mm and 24 mm, respectively. Regarding the lens 71 used in the present embodiment, the maximum thickness of the convex portions 71a is 5 mm.

Materials, dimensions and the like of the respective elements of the semiconductor light-emitting devices 1 (see FIGS. 1A to C) used in the present embodiment are as follows:

the electrical insulating substrate 10: high purity Si substrate (thickness: 0.2 mm, $D_1$ (see FIG. 1C): 2 mm);

the height of the phosphor layer 11 relative to the conductive patterns 25a and 25b (see FIG. 1) as reference plane: 0.4 mm;

the first conductivity type layer 14: p-GaN layer;

the light-emitting layer 15: InGaN/GaN quantum well light-emitting layer;

the second conductivity type layer 16: n-GaN layer;

the thickness of the semiconductor multilayer film 12: 3 μm;

the single crystal substrate 13: GaN substrate (thickness: 0.2 mm);

the radius $D_2$ of the region 10d in which the phosphor layer 11 is formed on the electrical insulating substrate 10 (see FIG. 1C): 1.8 mm;

the length $D_3$ of the diagonal line of the outer edge 16a of the second conductivity type layer 16 (see FIG. 1C): 1 mm.

Figure 20A:
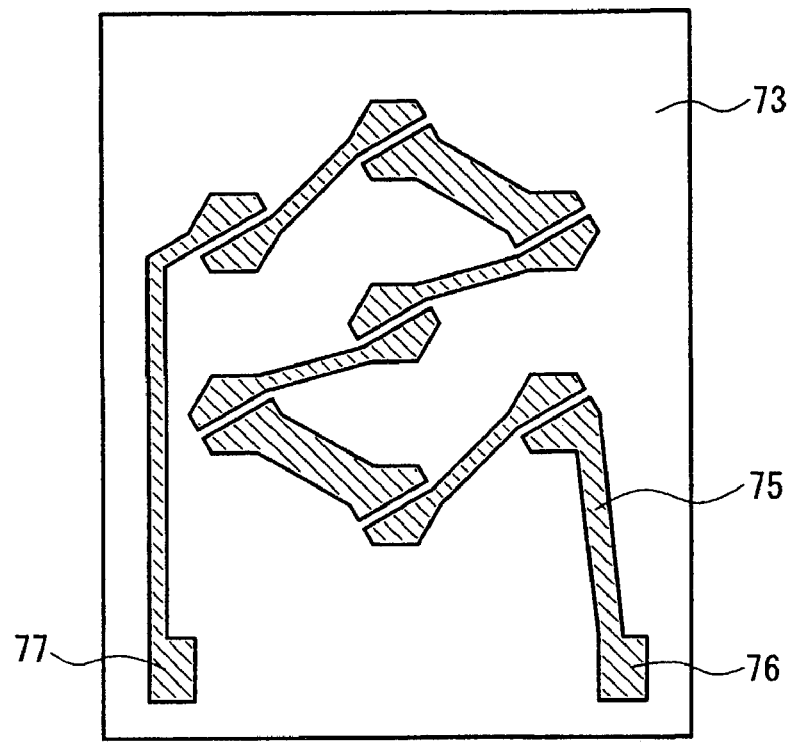
FIGS. 20A and B are plan views for explaining the respective steps of a manufacturing method of a lighting module according to Embodiment 4 of the present invention.

The following describes a method for manufacturing the lighting module 4, with reference to the drawings as required. FIGS. 20A and B and FIGS. 21A and B to be referred to herein are plan views for explaining the respective steps of the manufacturing method of the lighting module 4. Herein, the same reference numerals are assigned to the same elements as those in FIGS. 19A to C and their explanations are omitted.

Firstly, a first electrical insulating layer 73 is formed on an aluminum substrate 72 (see FIG. 19B) by thermocompression bonding, and a wiring pattern 75 shown in FIG. 20A is formed on a principal surface of the first electrical insulating layer 73 by a well-known transferring method.

Figure 20B:
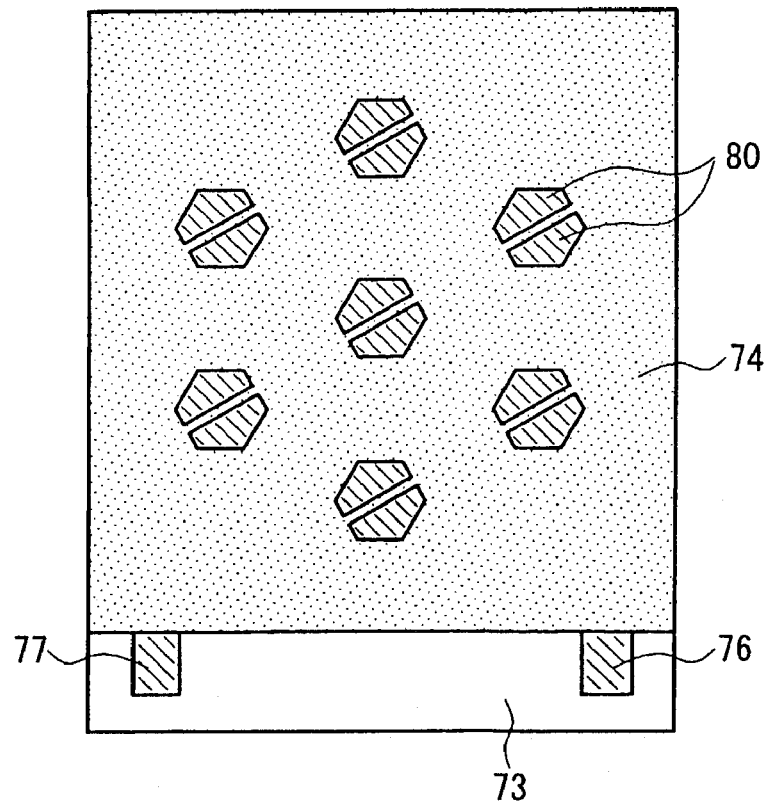

Following this, as shown in FIG. 20B, a second electrical insulating layer 74 is laminated on the first electrical insulating layer 73, where holes corresponding to the mounting positions 80 of the semiconductor light-emitting devices 1 are formed in the second electrical insulating layer 74, and then thermocompression bonding is applied thereto.

Figure 21A:
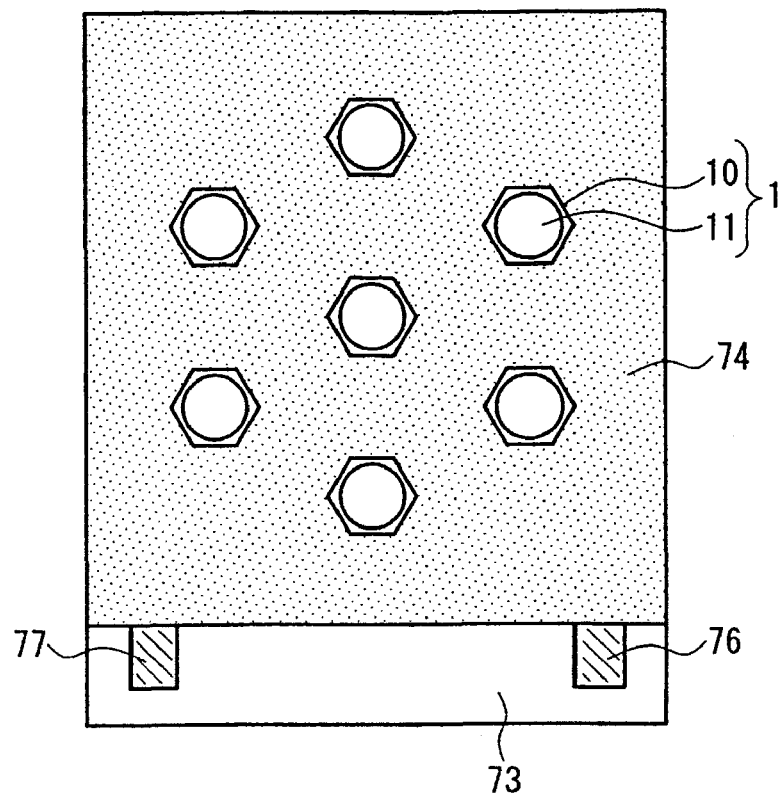
FIGS. 21A and B are plan views for explaining the respective steps of a manufacturing method of the lighting module according to Embodiment 4 of the present invention.
Figure 21B:
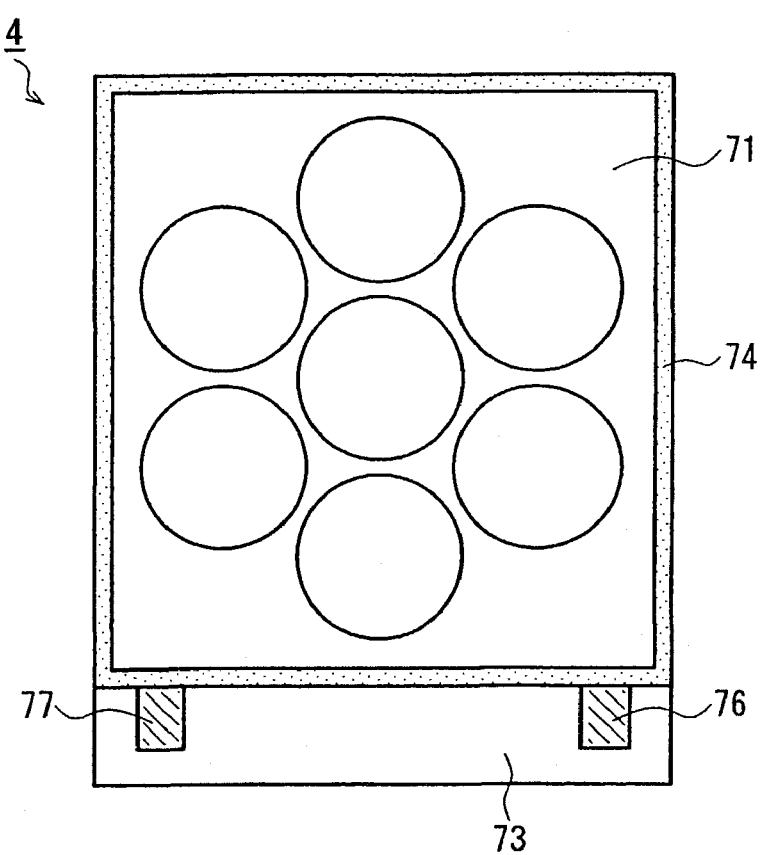

Next, as shown in FIG. 21A, the semiconductor light-emitting devices 1 are mounted at the mounting positions 80 (see FIG. 20B) of the wiring pattern 75. Then, as shown in FIG. 21B, the lens 71 is bonded to the second electrical insulating layer 74, whereby a lighting module 4 can be obtained.

Figure 22:
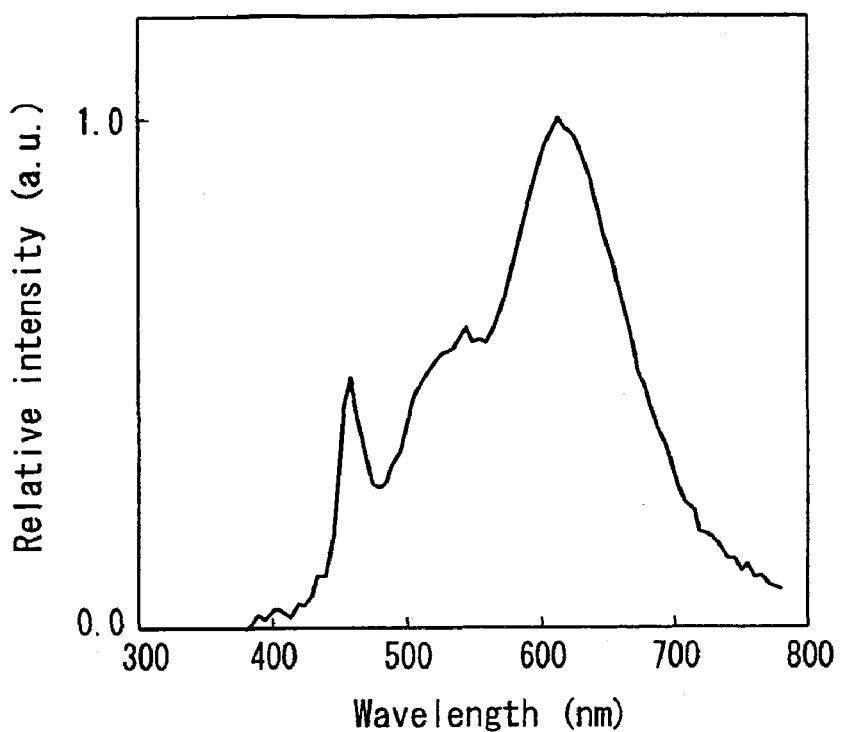
FIG. 22 shows an emission spectrum of illumination light extracted from a lighting module according to Embodiment 4 of the present invention.
Figure 23:
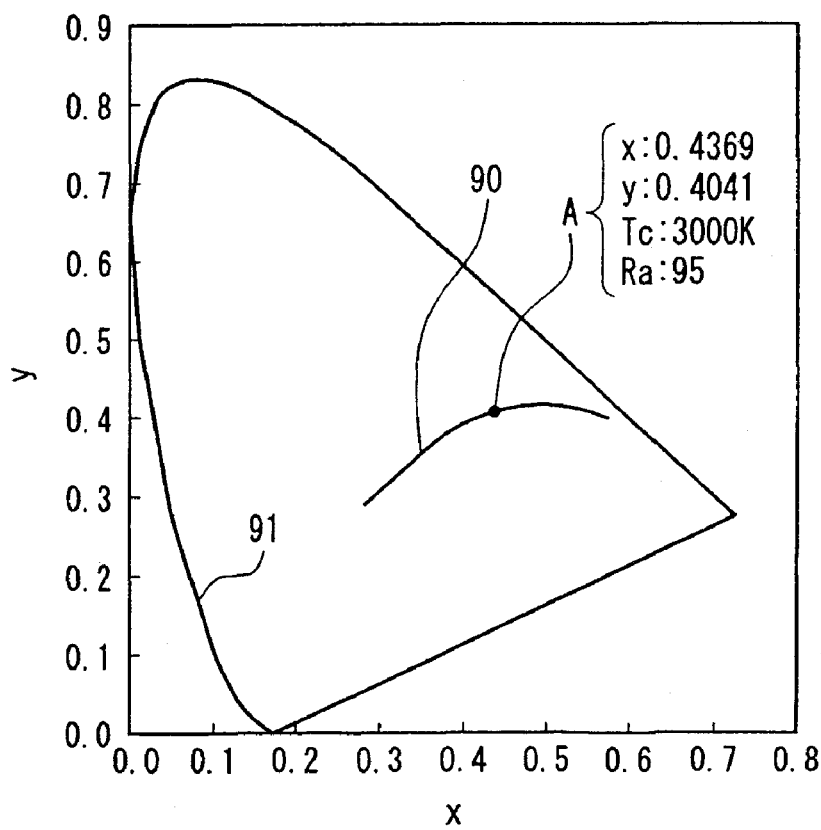
FIG. 23 shows x-y chromaticity coordinates for indicating the luminescent color of the illumination light extracted from a lighting module according to Embodiment 4 of the present invention.

The following describes properties of the lighting module 4. When a driving voltage 24.5 V is applied to the lighting module 4 so that a current of 350 mA flows through the lighting module 4, the overall luminous flux of the extracted illumination light becomes 400 lm, and its emission spectrum is as shown in FIG. 22. The luminescent color of the illumination light corresponds to a point A (x: 0.4369, y: 0.4041) on the black body locus 90 in the x-y chromaticity coordinates shown in FIG. 23. The color temperature Tc is 3,000 K and the general color rendering index Ra is 95. The curve 91 in the x-y chromaticity coordinates of FIG. 23 represents the locus of monochromatic light from 380 to 780 nm.

Embodiment 5

Figure 24:
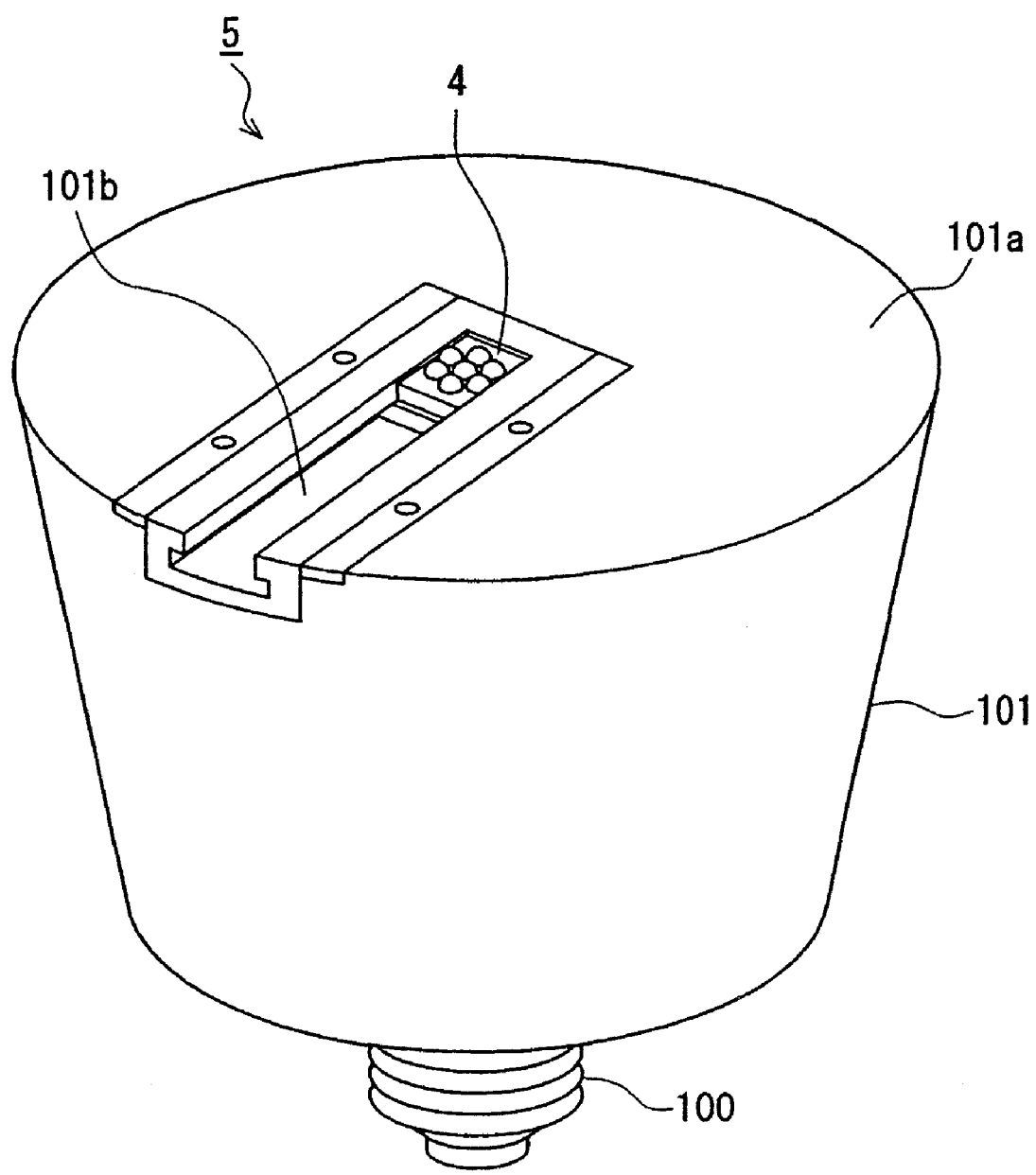
FIG. 24 is a perspective view of a lighting device according to Embodiment 5 of the present invention.

The following describes a lighting device according to Embodiment 5 of the present invention, with reference to the drawings as required. FIG. 24 to be referred to herein is a perspective view of a lighting device according to Embodiment 5. The lighting device according to Embodiment 5 includes the above-described lighting module 4 according to Embodiment 4.

As shown in FIG. 24, the lighting device 5 includes: a base 100 that is a type capable of being screwed into a socket for general incandescent lamps; a case 101 fixed to an end portion of the base 100; a lighting module 4 installed in the case 101; and a driving circuit (not illustrated) for driving the lighting module 4.

The case 101 has a housing portion 101b in a flat plane 101a of the case opposite to the base 100 that allows installation of the lighting module 4 therein. The lighting module 4 is housed in this housing portion 101b. A feeding portion (not illustrated) connecting with the driving circuit is provided in the housing portion 101b, and this feeding portion allows a predetermined driving current to flow through the lighting module 4.

The thus configured lighting device 5 adopts the lighting module 4 as a light source that is one embodiment of the present invention, and therefore non-uniformity in color of the extracted light can be suppressed and a higher luminous flux can be obtained.

INDUSTRIAL APPLICABILITY

The present invention is effective for lighting devices used for general lighting, lighting for representation (sign lamps or the like), lighting for cars (especially headlamp) and the like.

The invention claimed is:

1. A semiconductor light-emitting device, comprising:
   a semiconductor multilayer film in which a first conductivity type layer, a light-emitting layer and a second conductivity type layer are laminated in this stated order, the second conductivity type layer being disposed on an extraction side of light emitted from the light-emitting layer;
   a first electrode contacting with the first conductivity type layer;
   a second electrode contacting with the second conductivity type layer;
   a substrate disposed on a side of the first conductivity type layer of the semiconductor multilayer film and supporting the semiconductor multilayer film;
   first and second terminals formed on a rear face with respect to a principal surface of the substrate on a side of the semiconductor multilayer film;
   a first conductive member that electrically connects the first electrode with the first terminal;
   a second conductive member that electrically connects the second electrode with the second terminal; and
   a phosphor layer formed on the substrate so as to cover the semiconductor multilayer film, the phosphor layer absorbing the light emitted from the light-emitting layer so as to emit fluorescence,
   wherein the first electrode is formed contacting with a principal surface of the first conductivity type layer, and the phosphor layer is formed contacting with a principal surface of the second conductivity type layer.

2. The semiconductor light-emitting device according to claim 1, wherein an outer edge of the principal surface of the substrate is formed in a substantially regular hexagonal shape.

3. The semiconductor light-emitting device according to claim 1, wherein the phosphor layer has an outer edge of a cross section taken in a direction parallel to the principal surface of the substrate, the outer edge having a substantially circular shape or a substantially regular polygonal shape having five or more sides, and an outer edge of the principal surface of the substrate is formed in a substantially circular shape or a substantially regular polygonal shape having five or more sides.

4. The semiconductor light-emitting device according to claim 1, wherein the phosphor layer is formed in a substantially truncated cone shape or a substantially hemispherical shape.

5. The semiconductor light-emitting device according to claim 1, wherein an outermost edge of the semiconductor multilayer film is formed in a substantially circular shape or a substantially regular polygonal shape having five or more sides.

6. The semiconductor light-emitting device according to claim 1, wherein the first and the second conductive members comprise via conductors formed in via holes provided in the substrate.

7. The semiconductor light-emitting device according to claim 1, wherein the first and the second conductive members have conductive patterns comprising a material capable of reflecting light, and the conductive patterns are formed on a substantially entire surface of the principal surface of the substrate on the semiconductor multilayer film side.

8. A lighting module, comprising:
the semiconductor light-emitting device according to claim 1, and
a mounting board for mounting the semiconductor light-emitting device.

9. A lighting device comprising the lighting module according to claim 8 as a light source.

10. A method for manufacturing a semiconductor light-emitting device, comprising the steps of:
forming a semiconductor multilayer film on one principal surface of a single crystal substrate so that the semiconductor multilayer film comprises a first conductivity type layer, a light-emitting layer and a second conductivity type layer in order of increasing proximity to the single crystal substrate, the second conductivity type layer being disposed on an extraction side of light emitted from the light-emitting layer;
forming first and second electrodes contacting with the first and the second conductivity type layers, respectively;
providing via holes in a substrate and then forming via conductors in the via holes;
forming conductive patterns on one principal surface of the substrate so as to electrically connect with the via conductors;
forming first and second terminals on a rear face of the substrate with respect to the principal surface so as to electrically connect with the conductive patterns through the via conductors;
electrically connecting the first electrode with the first terminal through one of the conductive patterns and one of the via conductors, and electrically connecting the second electrode with the second terminal through another conductive pattern and another via conductor;
forming on the substrate a phosphor layer absorbing the light emitted from the light-emitting layer to emit fluorescence so as to cover the semiconductor multilayer film and so that an outer edge of a cross section of the phosphor layer taken in a direction parallel to the principal surface of the substrate on the semiconductor multilayer film side has a substantially circular shape or a substantially regular polygonal shape having five or more sides; and
cutting the substrate into a substantially circular shape or a substantially regular polygonal shape having five or more sides so as to surround a region of the substrate on which the phosphor layer is formed.

11. A method for manufacturing a semiconductor light-emitting device, comprising the steps of:
forming a semiconductor multilayer film on one principal surface of a single crystal substrate so that the semiconductor multilayer film comprises a first conductivity type layer, a light-emitting layer and a second conductivity type layer in order of increasing proximity to the single crystal substrate, the second conductivity type layer being disposed on an extraction side of light emitted from the light-emitting layer;
forming a first electrode contacting with a principal surface of the first conductivity type layer;
aside from the above steps, providing via holes in a substrate and then forming via conductors in the via holes;
forming a conductive pattern on one principal surface of the substrate so as to electrically connect with one of the via conductors;
forming a metal layer on the conductive pattern;
bonding the first electrode and the metal layer so as to form a laminate in which the semiconductor multilayer film is sandwiched between the single crystal substrate and the substrate;
detaching the single crystal substrate from the semiconductor multilayer film;
forming a second electrode that electrically connects the second conductivity type layer with another via conductor;
forming on a rear face of the substrate with respect to the principal surface a first terminal that electrically connects with the conductive pattern trough the corresponding via conductor and a second terminal that electrically connects with the second electrode through the corresponding via conductor;
forming on the substrate a phosphor layer absorbing the light emitted from the light-emitting layer to emit fluorescence so that the phosphor layer contacts with a principal surface of the second conductivity type layer and covers the semiconductor multilayer film and so that an outer edge of a cross section of the phosphor layer taken in a direction parallel to the principal surface of the substrate on the semiconductor multilayer film side has a substantially circular shape or a substantially regular polygonal shape having five or more sides; and
cutting the substrate into a substantially circular shape or a substantially regular polygonal shape having five or more sides that surrounds a region of the substrate on which the phosphor layer is formed.

12. The method for manufacturing a semiconductor light-emitting device according to claim 11, wherein during the step of detaching the single crystal substrate from the semiconductor multilayer film, a laser beam is applied thereto from a side of the single crystal substrate so as to decrease a bonding force at an interface between the single crystal substrate and the semiconductor multilayer film so that the single crystal substrate can be detached from the semiconductor multilayer film.

* * * * *